(12) United States Patent
Kim et al.

(10) Patent No.: US 9,922,897 B1
(45) Date of Patent: Mar. 20, 2018

(54) METHOD OF MANUFACTURING SEMICONDUCTOR PACKAGE

(71) Applicants: Kyoung Hwan Kim, Yongin-si (KR); Taewoo Kang, Suwon-si (KR); Byung Lyul Park, Seoul (KR); Hyungjun Jeon, Seoul (KR)

(72) Inventors: Kyoung Hwan Kim, Yongin-si (KR); Taewoo Kang, Suwon-si (KR); Byung Lyul Park, Seoul (KR); Hyungjun Jeon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/481,446

(22) Filed: Apr. 6, 2017

(30) Foreign Application Priority Data

Sep. 13, 2016 (KR) ........................ 10-2016-0117915

(51) Int. Cl.
| | |
|---|---|
| *H01L 21/77* | (2017.01) |
| *H01L 23/31* | (2006.01) |
| *H01L 21/56* | (2006.01) |
| *H01L 21/48* | (2006.01) |
| *H01L 21/66* | (2006.01) |
| *H01L 23/544* | (2006.01) |
| *H01L 21/683* | (2006.01) |
| *H01L 23/00* | (2006.01) |

(52) U.S. Cl.
CPC ...... *H01L 23/3128* (2013.01); *H01L 21/4846* (2013.01); *H01L 21/563* (2013.01); *H01L 21/565* (2013.01); *H01L 21/568* (2013.01); *H01L 21/6835* (2013.01); *H01L 22/32* (2013.01); *H01L 23/544* (2013.01); *H01L 24/97* (2013.01); *H01L 2221/68345* (2013.01); *H01L 2221/68359* (2013.01); *H01L 2221/68381* (2013.01); *H01L 2223/54426* (2013.01)

(58) Field of Classification Search
CPC . H01L 21/4846; H01L 21/563; H01L 21/565; H01L 21/568; H01L 21/6835; H01L 22/32; H01L 23/3128; H01L 23/544; H01L 24/97
See application file for complete search history.

(56) References Cited

U.S. PATENT DOCUMENTS

| | | |
|---|---|---|
| 9,048,222 B2 | 6/2015 | Hung et al. |
| 9,087,832 B2 | 7/2015 | Huang et al. |
| 9,373,527 B2 | 6/2016 | Yu et al. |
| 9,379,041 B2 | 6/2016 | Hsu et al. |
| 9,391,041 B2 | 7/2016 | Lin |

(Continued)

FOREIGN PATENT DOCUMENTS

KR        101617316 B1        5/2016

*Primary Examiner* — Daniel Shook
(74) *Attorney, Agent, or Firm* — Renaissance IP Law Group LLP

(57) ABSTRACT

A method of manufacturing a semiconductor package includes forming a preliminary package, on a supporting substrate, which includes a connection substrate, a semiconductor chip and a molding pattern on the connection substrate and the semiconductor chip, forming a buffer pattern on the molding pattern, and forming a carrier substrate, on the buffer pattern, which includes a first portion contacting the buffer pattern and a second portion contacting the molding pattern.

20 Claims, 33 Drawing Sheets

(56) References Cited

U.S. PATENT DOCUMENTS

| | | |
|---|---|---|
| 2010/0301474 A1* | 12/2010 | Yang .................. H01L 21/6835 257/737 |
| 2011/0156239 A1 | 6/2011 | Jin |
| 2014/0110856 A1 | 4/2014 | Lin |
| 2014/0252646 A1 | 9/2014 | Hung et al. |
| 2014/0252647 A1 | 9/2014 | Huang et al. |
| 2015/0115464 A1 | 4/2015 | Yu et al. |
| 2015/0162256 A1 | 6/2015 | Hsu et al. |
| 2015/0287681 A1 | 10/2015 | Soh et al. |
| 2015/0380386 A1 | 12/2015 | Vincent et al. |
| 2016/0027694 A1 | 1/2016 | Truhitte et al. |

* cited by examiner

METHOD OF MANUFACTURING SEMICONDUCTOR PACKAGE

CROSS-REFERENCE TO RELATED APPLICATION

This application claims priority under 35 U.S.C. § 119 to Korean Patent Application No. 10-2016-0117915, filed on Sep. 13, 2016 in the Korean Intellectual Property Office, the disclosure of which is hereby incorporated by reference in its entirety.

TECHNICAL FIELD

Example embodiments of the present disclosure relate to methods of manufacturing the semiconductor package, more specifically, to methods of forming and removing a carrier substrate.

DISCUSSION OF THE RELATED ART

A semiconductor package can be manufactured by mounting a semiconductor chip on a printed circuit board substrate and electrically connecting the semiconductor chip to the printed circuit board substrate by, for example, a bonding wire or a bump. As demand for highly functional, higher speed, smaller electronic components increases with developments of the electronics industry, mounting methods in which multiple semiconductor chips are stacked on a single package substrate, or methods of stacking packages on one another, have emerged.

SUMMARY

According to example embodiments of the inventive concepts, a method of manufacturing a semiconductor package may include forming a preliminary package on a supporting substrate, which includes a connection substrate, a semiconductor chip and a molding pattern on the connection substrate and the semiconductor chip, forming a buffer pattern on the molding pattern, and forming a carrier substrate on the buffer pattern and the molding pattern, which includes a first portion contacting the buffer pattern and a second portion contacting the molding pattern.

According to example embodiments of the inventive concepts, a method of manufacturing a semiconductor package may include providing a preliminary package which includes a connection substrate, a semiconductor chip and a molding pattern, providing a buffer pattern on a first portion of the molding pattern, which exposes an upper surface of a second portion of the molding pattern, providing a carrier substrate on the buffer pattern and the molding pattern, which contacts the upper surface of the second portion of the molding pattern, and removing the second portion of the molding pattern to detach the carrier substrate from the molding pattern.

According to example embodiments of the inventive concepts, a method of manufacturing a semiconductor package may include forming a package on a supporting substrate, which includes a connection substrate including openings exposing the supporting substrate, semiconductor chips in respective ones of the openings and a molding pattern covering the supporting substrate and the semiconductor chips, forming a buffer pattern on the package, which exposes the molding pattern, and forming a carrier substrate on the buffer pattern and the molding pattern, which contacts an upper surface of the buffer pattern and an upper surface of the exposed molding pattern.

According to example embodiments of the inventive concepts, a method of manufacturing a semiconductor package may include providing connection substrate on a supporting substrate, wherein the connection substrate has a plurality of openings. A semiconductor chip may be arranged on the supporting substrate and in each of the plurality of openings of the connection substrate. A molding pattern may be formed to cover an upper surface of each semiconductor chip and an upper surface of the connection substrate. A carrier substrate may be arranged on the molding pattern such that the carrier substrate extends over the upper surface of each semiconductor chip and the upper surface of the connection substrate. The carrier substrate may be spaced apart from the molding pattern at a region over the upper surface of each semiconductor chip, and may be adhered to the molding pattern at a region over the upper surface of connection substrate. After the carrier substrate is arranged as discussed above, the supporting substrate may be removed.

DETAILED DESCRIPTION OF THE EMBODIMENTS

Various example embodiments will now be described more fully with reference to the accompanying drawings in which some example embodiments are shown. However, the concepts described herein may be embodied in many alternate forms and should not be construed as limited to only example embodiments set forth herein.

Figure 1A:
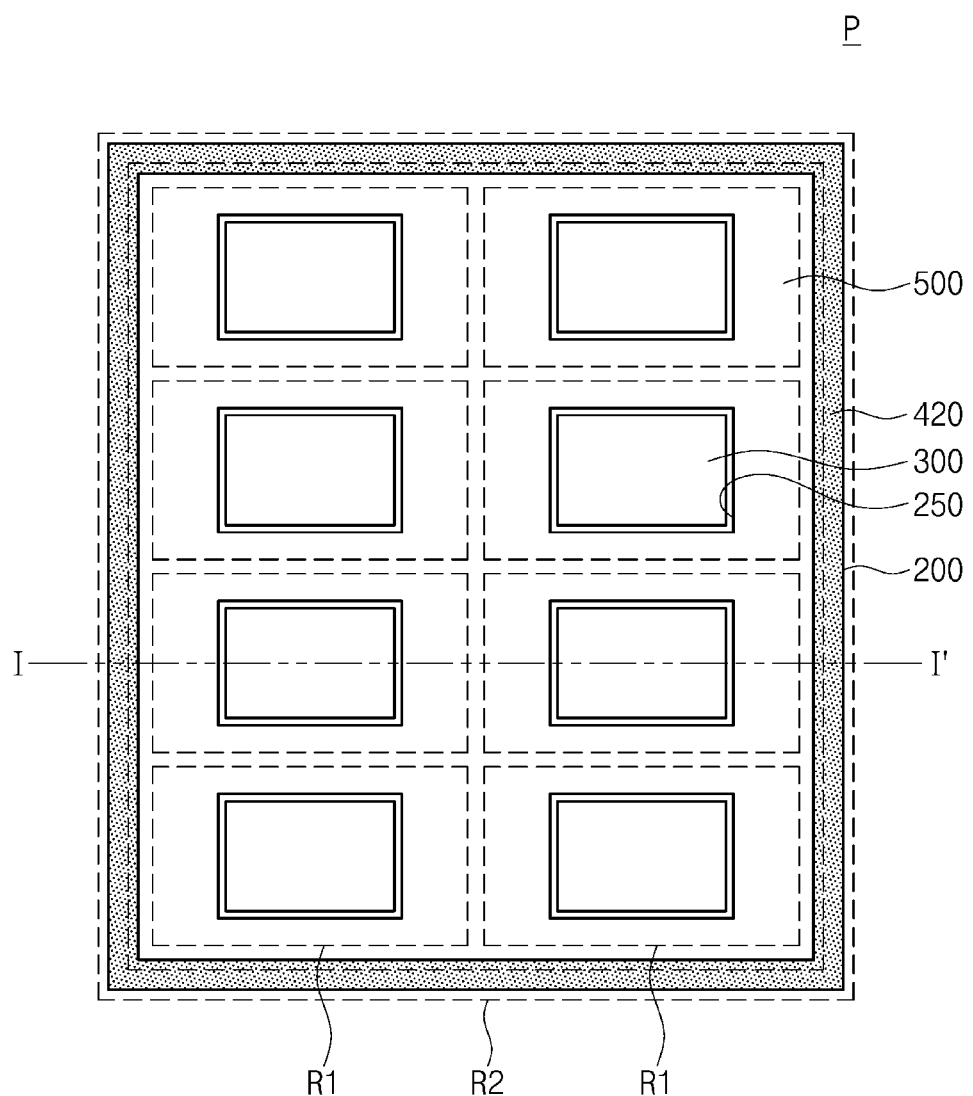
FIGS. 1A, 2A and 3A are plan views illustrating a method of manufacturing a semiconductor package according to example embodiments.
Figure 1B:
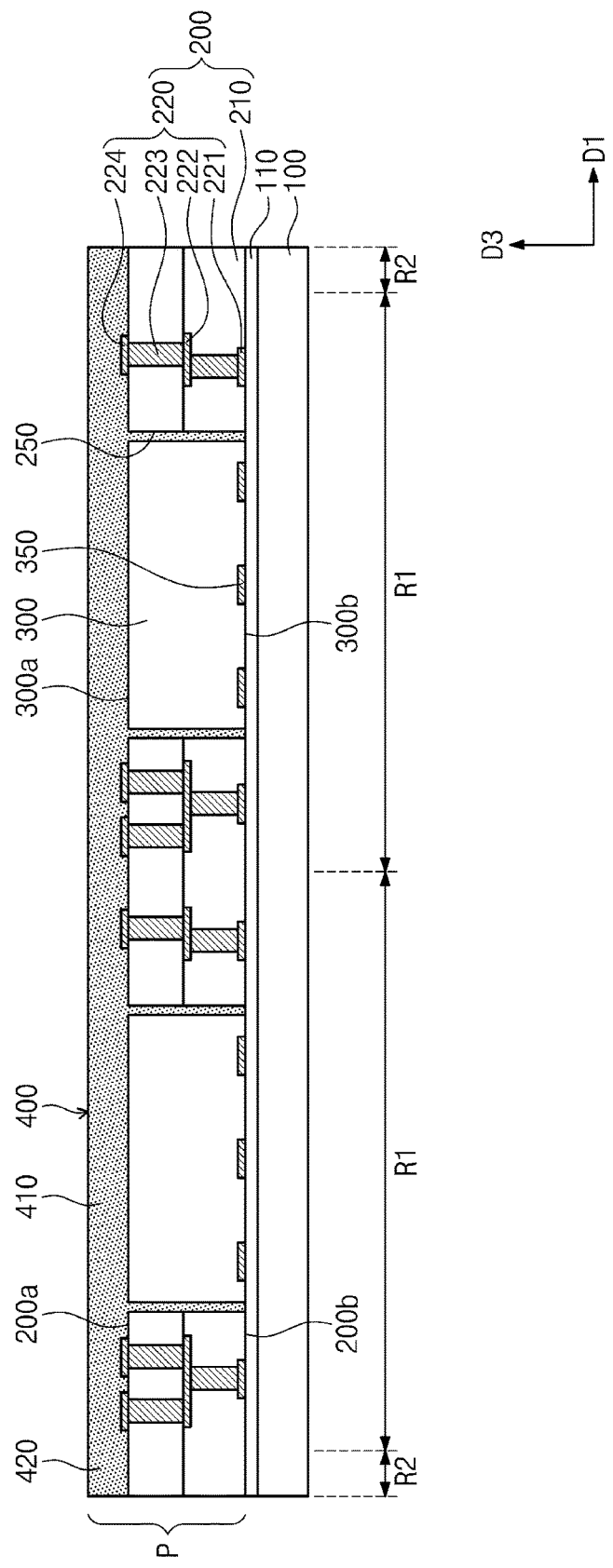
FIGS. 1B through 1E, 2B through 2E, 3B and 4 are cross-sectional views illustrating a method of manufacturing a semiconductor package according to example embodiments.
Figure 1C:
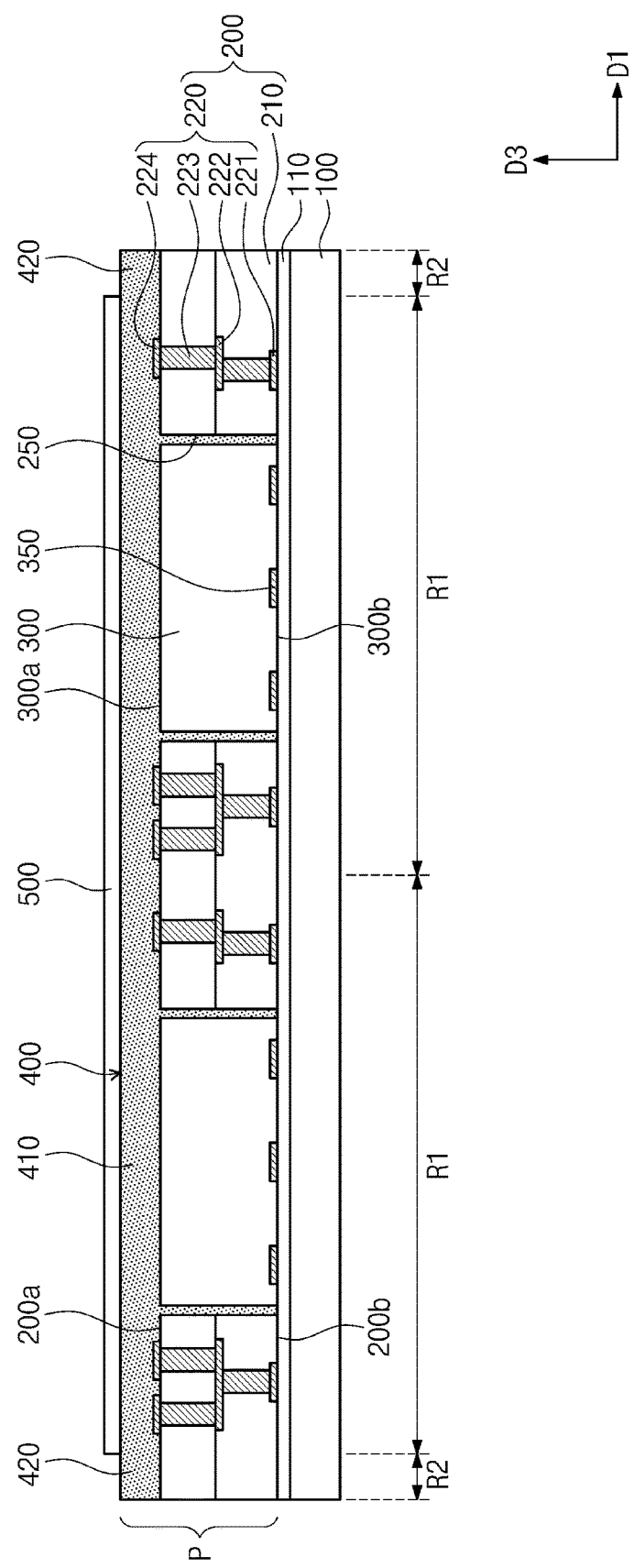
Figure 1D:
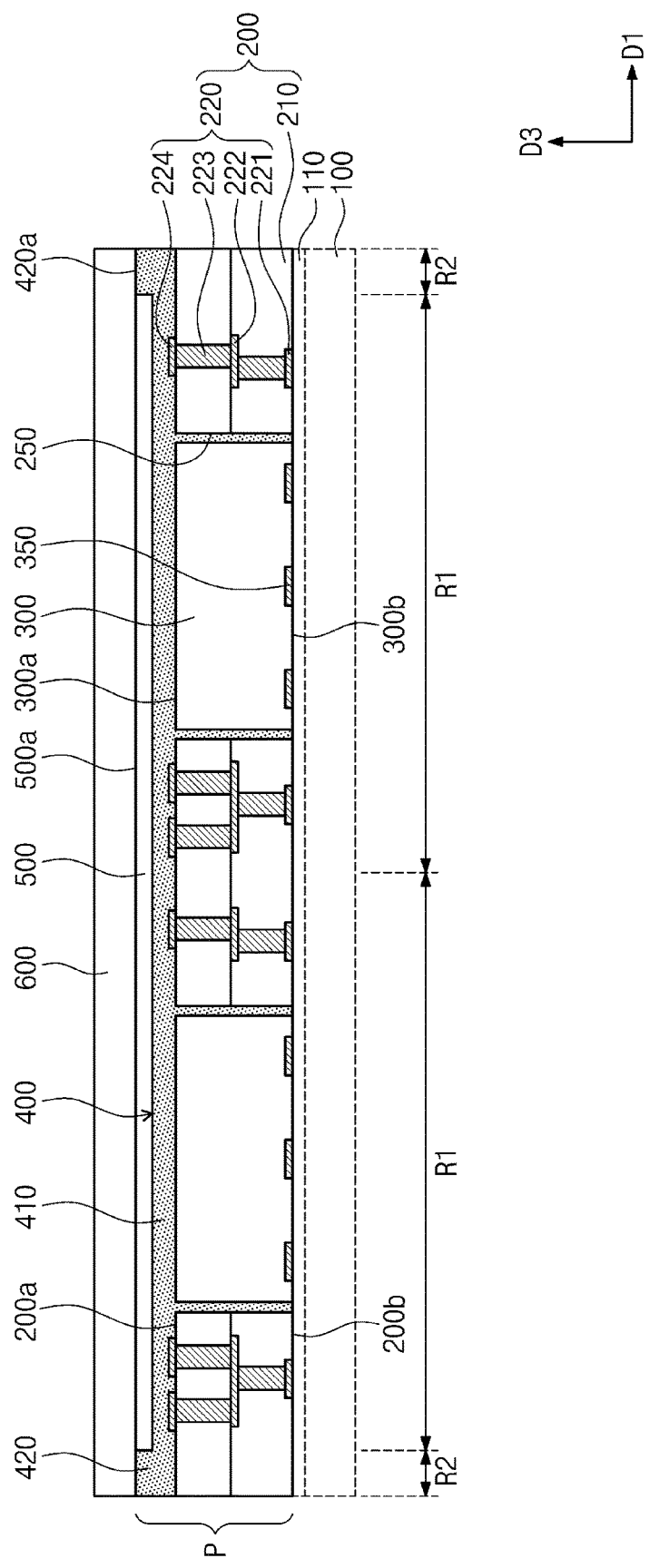
Figure 1E:
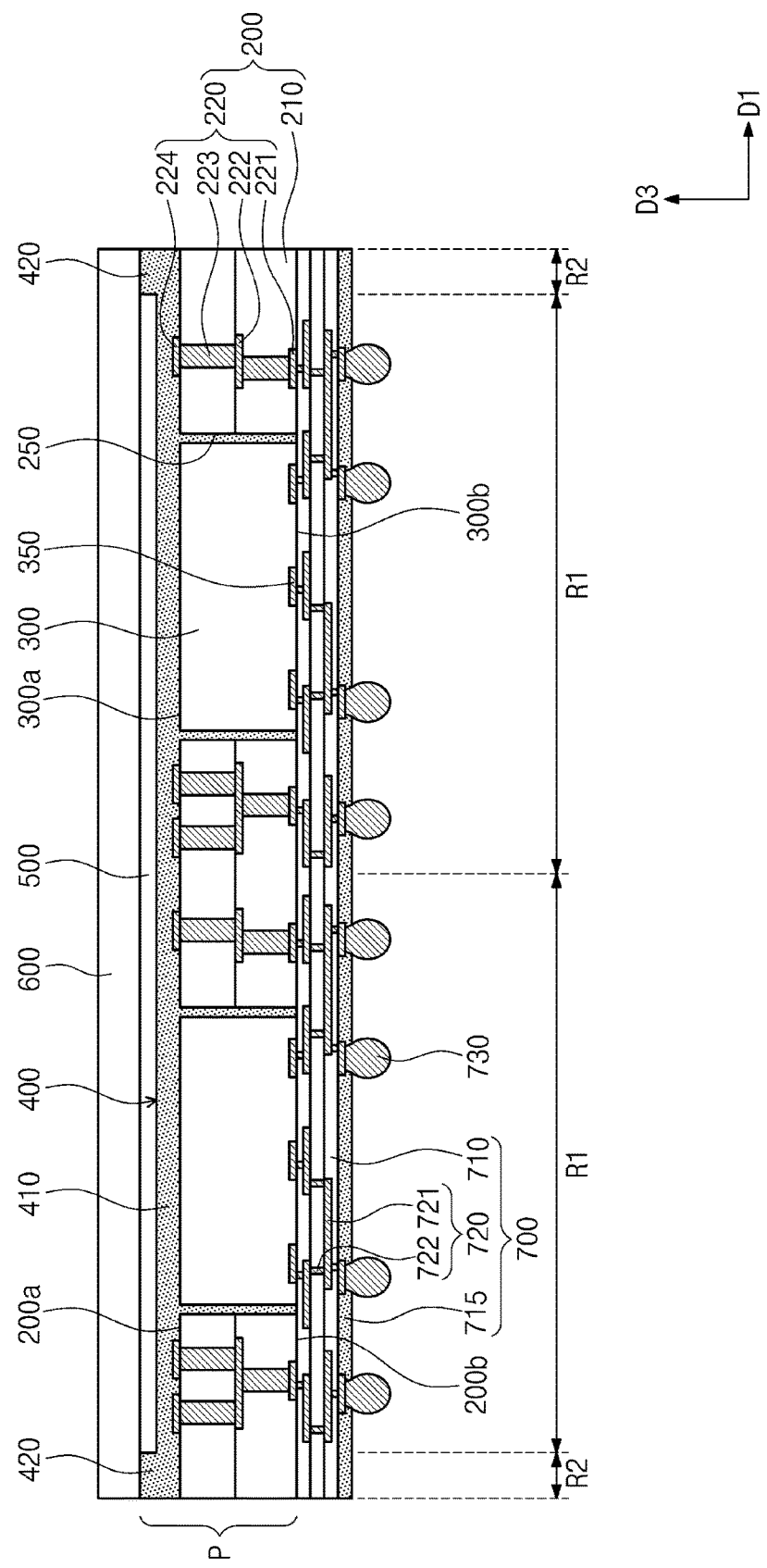
Figure 2A:
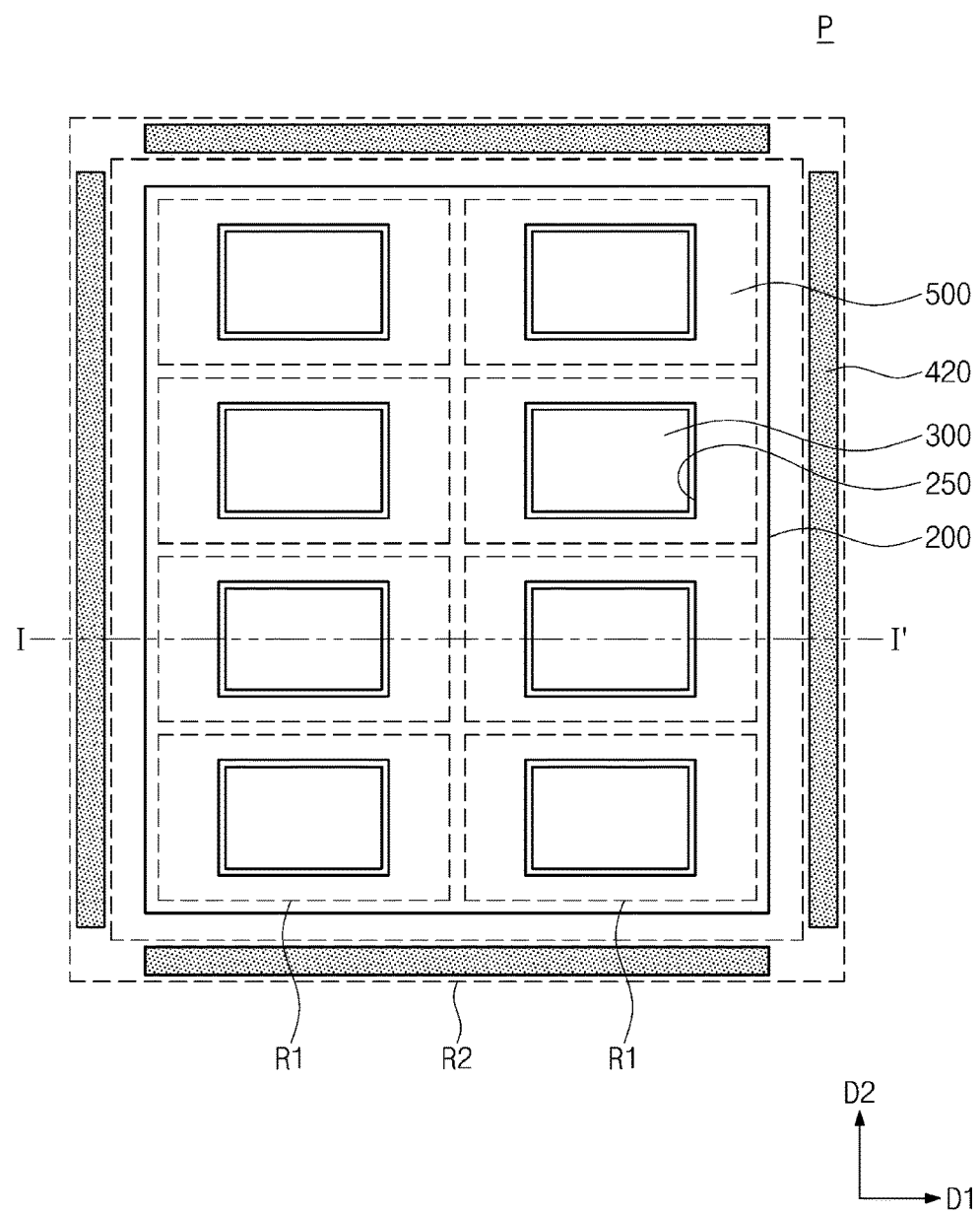
Figure 2B:
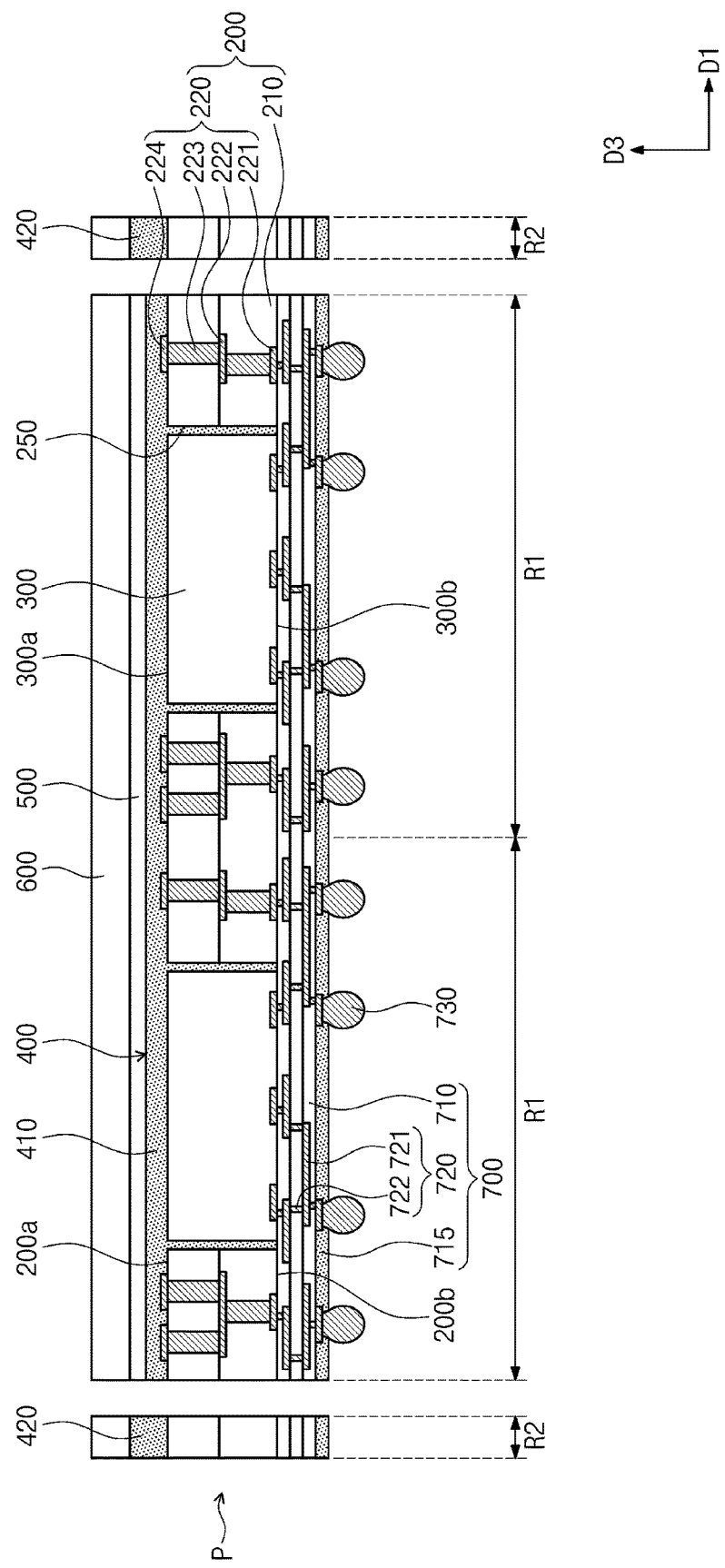
Figure 2C:
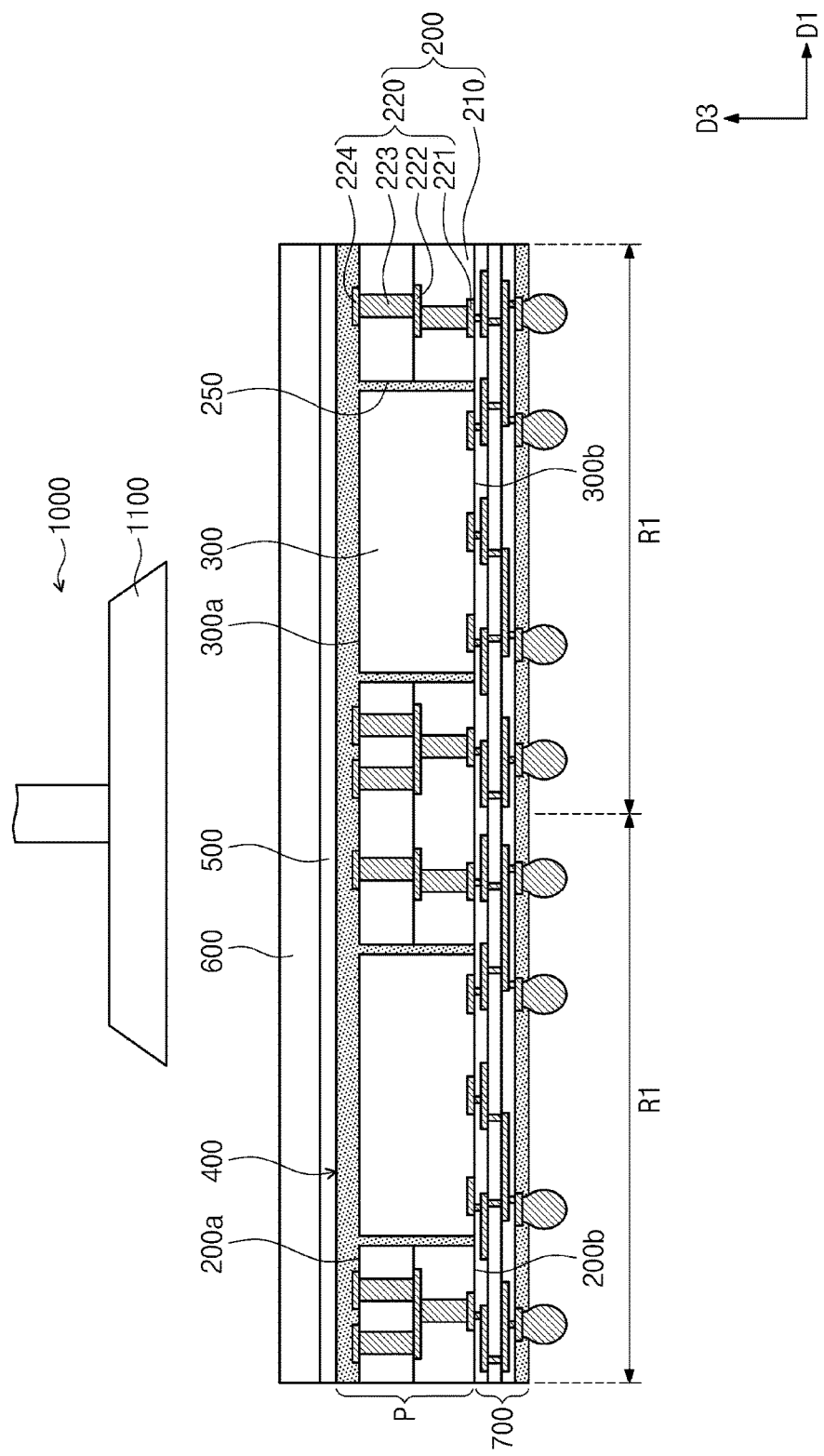
Figure 2D:
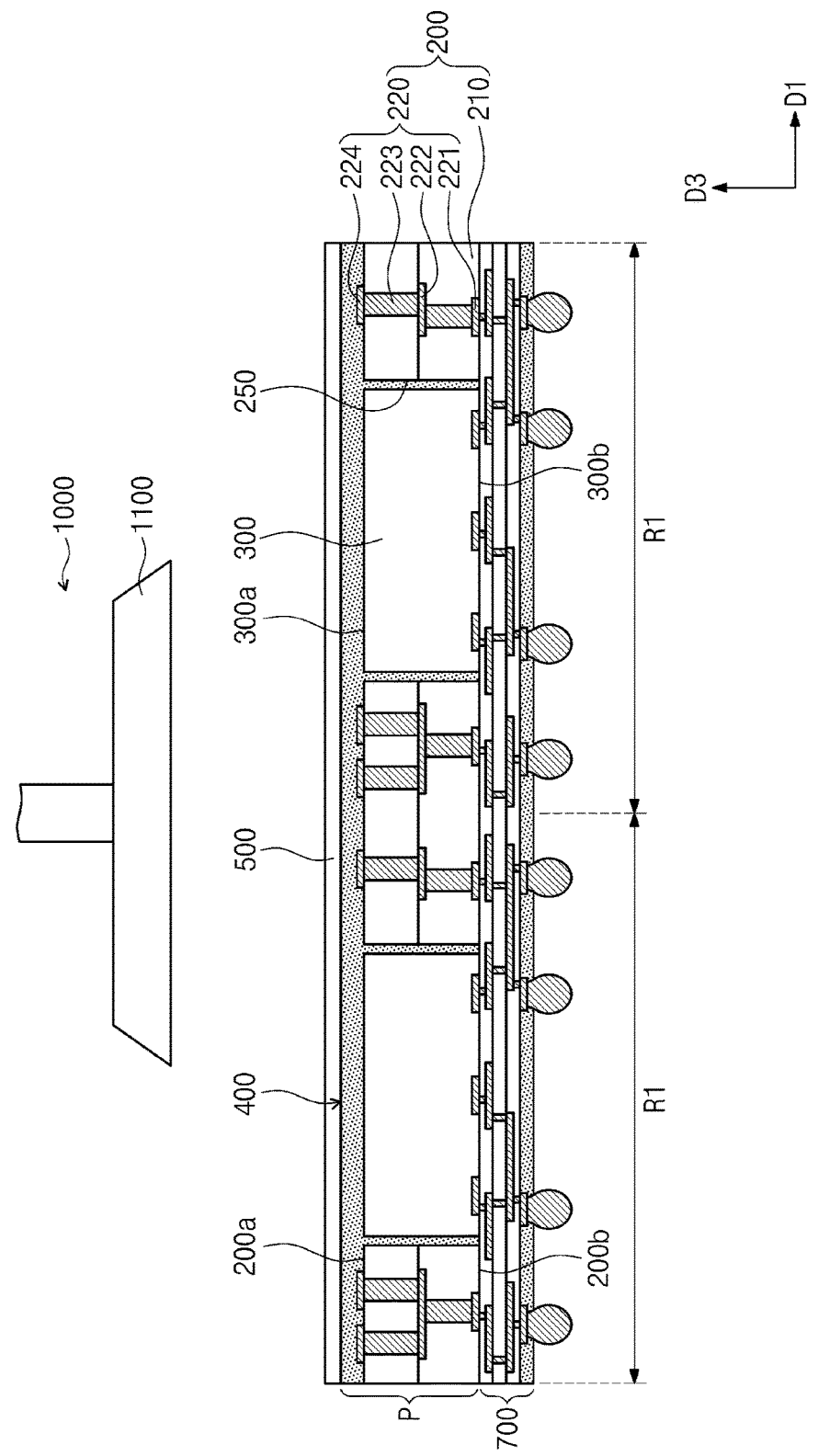
Figure 2E:
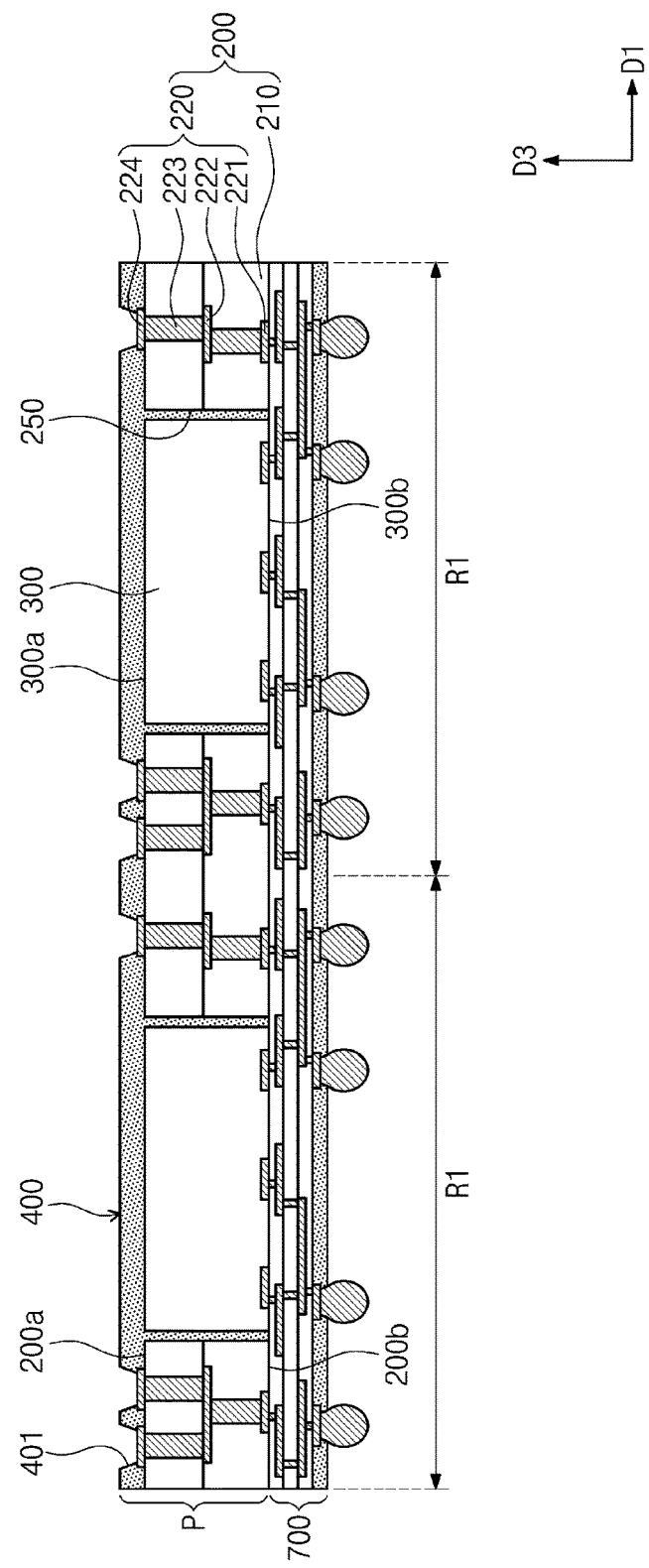
Figure 3A:
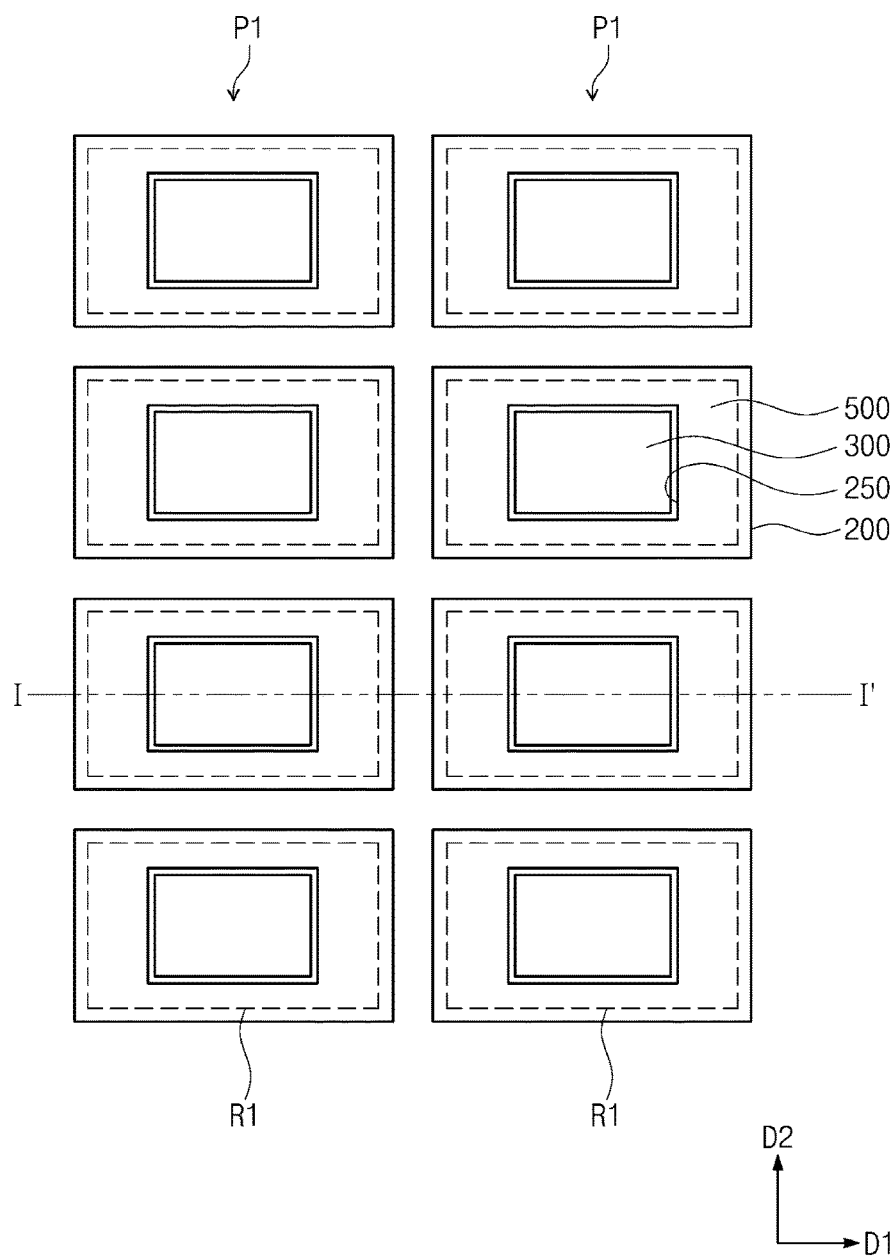
Figure 3B:
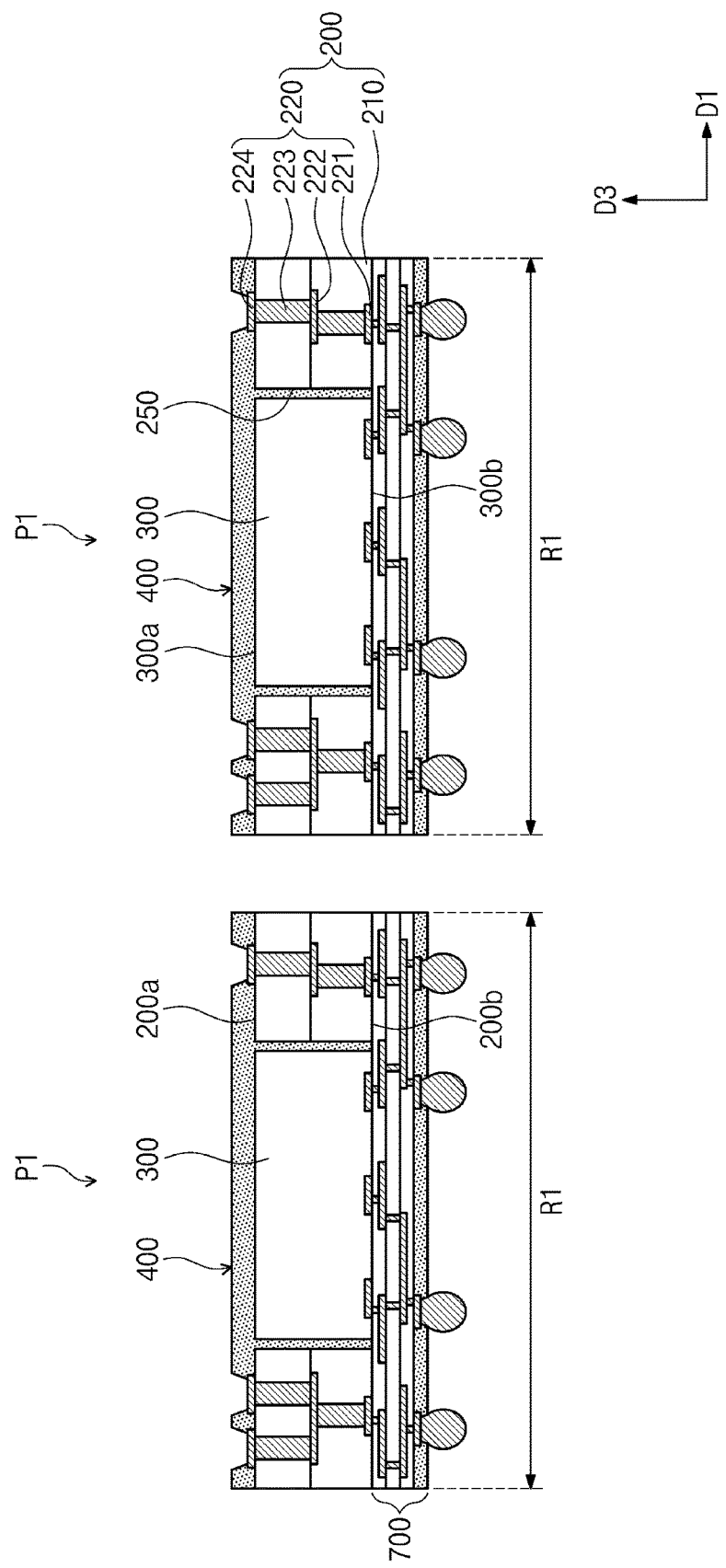

FIGS. 1A, 2A and 3A are plan views illustrating a method of manufacturing a semiconductor package according to example embodiments. FIGS. 1B through 1E, 2B through 2E, 3B and 4 are cross-sectional views illustrating a method of manufacturing a semiconductor package according to example embodiments. FIGS. 1B through 1E are cross-sectional views taken along line I-I' in FIG. 1A. FIGS. 2B through 2E are cross-sectional views taken along line I-I' in FIG. 2A. FIG. 3B is a cross-sectional view taken along line I-I' in FIG. 3A.

Referring to FIGS. 1A and 1B, a preliminary package P may be formed on a supporting substrate 100. The preliminary package P may be formed at a panel level. The preliminary package P may include a connection substrate 200, first semiconductor chips 300 and a molding pattern 400. When viewed in plan view, the preliminary package P may include a plurality of first regions R1 and a second region R2. The first regions R1 of the preliminary package P may be provided in a central region of the preliminary package P. The second region R2 of the preliminary package P may be provided in an edge region of the preliminary package P and may surround the first regions R1.

The connection substrate 200 may be disposed on the supporting substrate 100. The connection substrate 200 may be attached on the supporting substrate 100 by an adhesion layer 110. As an example, the connection substrate 200 may include a printed circuit board (PCB) substrate. The connection substrate 200 may include base layers 210 and a conductive member 220. The base layers 210 may include a non-conductive material. In an embodiment, the base layers 210 may include a silicone-based material, a polymer, or the like or any combination thereof. The conductive member 220 may be disposed in the base layers 210. The conductive member 220 may include a first pad 221, a wiring pattern 222, vias 223 and a second pad 224. The first pad 221 may be disposed on a lower surface 200b of the connection substrate 200. The vias 223 may penetrate the base layers 210. The wiring pattern 222 may be disposed between the base layers 210 and may be directly connected to the vias 223. The second pad 224 may be disposed on an upper surface 200a of the connection substrate 200 may be connected to at least one of the vias 223. The second pad 224 may not be aligned with the first pad 221 in a third direction D3. The third direction D3 may be a direction vertical to the lower surface 200b of the connection substrate 200. A first direction D1 and a second direction D2 may be parallel to the lower surface 200b of the connection substrate 200. The first direction D1 may cross the second direction D2.

The conductive member 220 may include a metal such as copper, aluminum, nickel, etc., or an alloy thereof. Openings 250 may be formed in the connection substrate 200. The openings 250 may expose the supporting substrate 100.

The first semiconductor chips 300 may be provided on the supporting substrate 100. The first semiconductor chips 300 may be provided in the first regions R1, respectively, of the preliminary package P. The first semiconductor chips 300 may be disposed in the openings 250, respectively, of the connection substrate 200. The connection substrate 200 may surround the respective first semiconductor chips 300. Chip pads 350 may be disposed on a lower surface 300b of each of the semiconductor chips 300.

The molding pattern 400 may be formed on the upper surface 200a of the connection substrate 200 and upper surfaces 300a of the first semiconductor chips 300. The molding pattern 400 may extend in or fill gaps between the connection substrate 200 and the first semiconductor chips 300. The molding pattern 400 may include a soft material, for example, an insulating polymer. The molding pattern 400 may be formed using, for example, a polymer sheet. In some embodiments, the molding pattern 400 may include a build-up film or laminated multiple layers.

The molding pattern 400 may include a first portion 410 and a second portion 420. When viewed in plan view, the first portion 410 of the molding pattern 400 may be disposed on the central region of the preliminary package P and may overlap the plurality of first regions R1. When viewed in plan view, the second portion 420 of the molding pattern 400 may overlap the second region R2. The second portion 420 of the molding pattern 400 may be connected to the first portion 410 of the molding pattern 400.

Referring to FIGS. 1A and 1C, a buffer pattern 500 may be disposed on the first regions R1 of the preliminary package P. The buffer pattern 500 may cover the first portion 410 of the molding pattern 400 and may expose the second portion 420 of the molding pattern 400. The buffer pattern 500 may include a non-adhesive material (i.e., a material that does not adhere to, or that does not significantly adhere to, a material of the molding pattern 400, or to a material of a carrier substrate 600, which is discussed below). The buffer pattern 500 may be disposed on the molding pattern 400 without being attached to the molding pattern 400. A lower surface of the buffer pattern 500 may not be bonded to an upper surface of the molding pattern 400. The buffer pattern 500 may not be formed by a deposition process. As an example, the buffer pattern 500 may include a Teflon sheet.

Referring to FIGS. 1A and 1D, a carrier substrate 600 may be provided on the buffer pattern 500. In a process of forming the carrier substrate 600, pressure may be applied to the buffer pattern 500 and the first portion 410 of the molding pattern 400. Since the molding pattern 400 is soft, the first portion 410 of the molding pattern 400 may be compressed by the applied pressure. An upper surface 420a of the second portion 420 of the molding pattern 400 may be at least substantially coplanar with an upper surface 500a of the buffer pattern 500. The carrier substrate 600 may contact the upper surface 500a of the buffer pattern 500 and the upper surface 420a of the second portion 420 of the molding pattern 400. The carrier substrate 600 may include a first portion and a second portion. The first portion of the carrier substrate 600 may physically contact the buffer pattern 500, but the buffer pattern 500 may not be attached to the carrier substrate 600. Rather, the second portion of the carrier substrate 600 may contact and be adhered to the second portion 420 of the molding pattern 400. Thus, the carrier substrate 600 may be attached to the preliminary package P by the second portion 420 of the molding pattern 400. Since the second portion 420 of the molding pattern 400 is provided in the edge region of the preliminary package P, the carrier substrate 600 may be stably fixed to the preliminary package P. In some embodiments, before the carrier substrate 600 is provided, the molding pattern 400 may be uncured and, after the carrier substrate 600 is provided, the molding pattern 400 may be cured.

The supporting substrate 100 and the adhesion layer 110 may be removed (e.g., as indicated by the dashed lines) to expose a lower surface of the preliminary package P, for example, the lower surfaces 300b of the first semiconductor chips 300 and the lower surface 200b of the connection substrate 200.

Referring to FIGS. 1A and 1E, insulating patterns 710, a redistribution pattern 720 and a protection layer 715 may be formed on the lower surface of the preliminary package P, for example, on the lower surfaces 300b of the first semiconductor chips 300 and the lower surface 200b of the connection substrate 200, to thus form a first substrate 700 (also referred to herein as a "redistribution substrate"). The redistribution pattern 720 may include a conductive pattern 721 between the insulating patterns 710 and a conductive via 722 penetrating the insulating patterns 710. The redistribution pattern 720 may include copper, aluminum, or the like or any combination thereof. The redistribution pattern 720 may be connected to the chip pads 350 of the first semiconductor chips 300 and the first pad 221 of the connection substrate 200. The protection layer 715 may be formed on a lower surface of the insulating patterns 710. The protection layer 715 may include an insulating material. For example, the protection layer 715 may include the same material as the molding pattern 400. It should be recognized, however, that the protection layer 715 is optional and may be omitted. Since the first substrate 700 is used as a redistribution substrate, the first substrate 700 may have a thin thickness compared to the connection substrate 200.

An external terminal 730 may be formed on a lower surface of the first substrate 700. The external terminal 730 may be connected to the redistribution pattern 720. The external terminal 730 may include a metal. The external terminal 730 may include a solder ball. The external terminal 730 may be electrically connected to the second pad 224 by the redistribution pattern 720 and the conductive member 220. The external terminal 730 may not be aligned with the second pad 224 in the third direction D3. The number of external terminals 730 may be different from the number of the second pad 224. An arrangement freedom degree of the second pad 224 may be increased by the conductive member 220 and the redistribution pattern 720.

Referring to FIGS. 2A and 2B, a first removing process of the carrier substrate 600 may be performed. The first removing process of the carrier substrate 600 may include performing a sawing process on the preliminary package P and the carrier substrate 600 (e.g., to separate the second region R2 of the preliminary package P from the first regions R1 of the preliminary package P). For example, a sawing process may be performed at the second region R2 of the preliminary package P (e.g., at the second portion 420 of the molding pattern 400) to separate the second region R2 from the first regions R1 of the preliminary package P, thereby removing the second region R2 from the preliminary package P. At this time, the carrier substrate 600 on the second portion 420 of the molding pattern 400 may also be separated from the first regions R1 of the preliminary package P. Hereinafter, in example embodiments, the portion of the molding pattern 400 remaining after the first removing process of the carrier substrate 600 may include the first portion 410 of the molding pattern 400. The carrier substrate 600 may be separated from the molding pattern 400 after the sawing process. Since the carrier substrate 600 does not adhere to the buffer pattern 500, the carrier substrate 600 may be easily detached from the preliminary package P.

Referring to FIGS. 2A and 2C, a second removing process of the carrier substrate 600 may be performed to detach the carrier substrate 600 from the buffer pattern 500. As an example, the carrier substrate 600 may be held to a vacuum suction head 1100 of a removal apparatus 1000, and thus the carrier substrate 600 may be detached from the buffer pattern 500. According to example embodiments, since the buffer pattern 500 includes the non-adhesive material, the carrier substrate 600 may be separated from the buffer pattern 500 without applying an excessive pressure that would have been required if the buffer pattern 500 was formed of an adhesive material. Since excessive pressure is not applied to the preliminary package P in the removing process of the carrier substrate 600, damage to the preliminary package P and the first substrate 700 may be reduced or prevented altogether.

Referring to FIGS. 2A and 2D, the buffer pattern 500 may be detached from the molding pattern 400. As an example, the buffer pattern 500 may be held to the vacuum suction head 1100 of the removal apparatus 1000, and thus the buffer pattern 500 may be easily detached from the molding pattern 400. The removal of the buffer pattern 500 may be performed using a removal apparatus that is different from, or the same as, the removal apparatus 1000 used in the second removing process of the carrier substrate 600 in FIG. 2C. If the buffer pattern 500 adheres to the molding pattern 400, the upper surface of the molding pattern 400 may be damaged in the removing process of the buffer pattern 500. For example, cracks may be generated on the upper surface of the molding pattern 400. In this case, the upper surface of the molding pattern 400 may have a high central-line average surface roughness Ra of, for example, more than 5 μm. An extra removing process (e.g., an etching process) of the buffer pattern 500 may further be performed. According to example embodiments, however, the buffer pattern 500 does not adhere to the molding pattern 400 and, as a result, the molding pattern 400 may not be damaged in the removing process of the buffer pattern 500. Thus, after the second removing process of the carrier substrate 600, the upper surface of the molding pattern 400 may have a central-line average surface roughness Ra of 0.1 μm to 3 μm. In the removing process of the buffer pattern 500, the first substrate 700, the connection substrate 200, first semiconductor chips 300 and the molding pattern 400 may not be damaged. Thus, the manufactured semiconductor package may have improved reliability. The extra removing process of the buffer pattern 500 may be omitted, and thus the removing process of the buffer pattern 500 may be simplified.

Referring to FIGS. 2A and 2E, after removing the buffer pattern 500, grooves 401 may be formed in the molding pattern 400 to expose the second pad 224.

Figure 4:
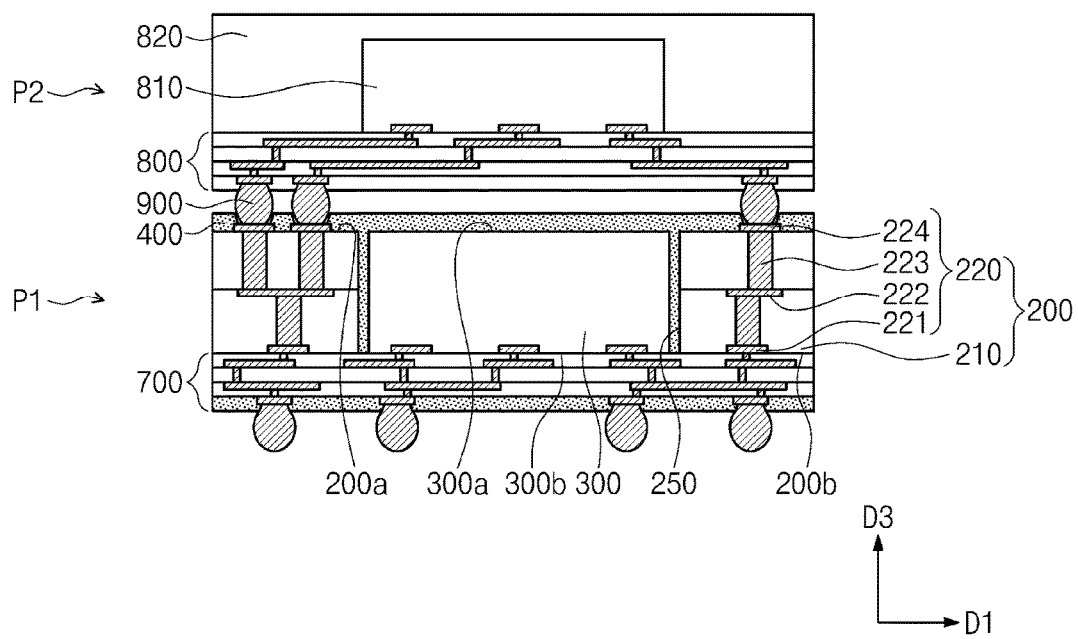

Referring to FIGS. 3A and 3B, the preliminary package P of FIGS. 2A and 2B may be singulated, and thus the first regions R1 of the preliminary package P may be separated from each other. The singulation of the preliminary package P may be performed by sawing the first substrate 700, the connection substrate 200 and the molding pattern 400. The separated first regions R1 of the preliminary package P may form first packages P1, respectively. The first packages P1 may each include the first substrate 700, each of the first semiconductor chips 300 and the molding pattern 400. In some embodiments, the singluation of the preliminary package P may be performed by a single process (e.g., along with the first removing process of the carrier substrate 600 described in FIG. 2B). In this case, the carrier substrate 600 and the buffer pattern 500 may remain on each of the first packages P1, and the second removing process of the carrier substrate 600 and the removing process of the buffer pattern 500 may be performed on each of the first packages P1. Referring to FIG. 4, a second package P2 may be mounted on the first package P1 of FIG. 3B to manufacture a semiconductor package. The second package P2 may include a second substrate 800, a second semiconductor chip 810 and a second molding pattern 820. The second semiconductor chip 810 may be mounted on the second substrate 800 by a flip chip method. In some embodiments, the second semiconductor chip 810 may be electrically connected to the second substrate 800 by a bonding wire. The molding pattern 820 may be formed on the second substrate 800 to cover the second semiconductor chip 810.

Figure 5A:
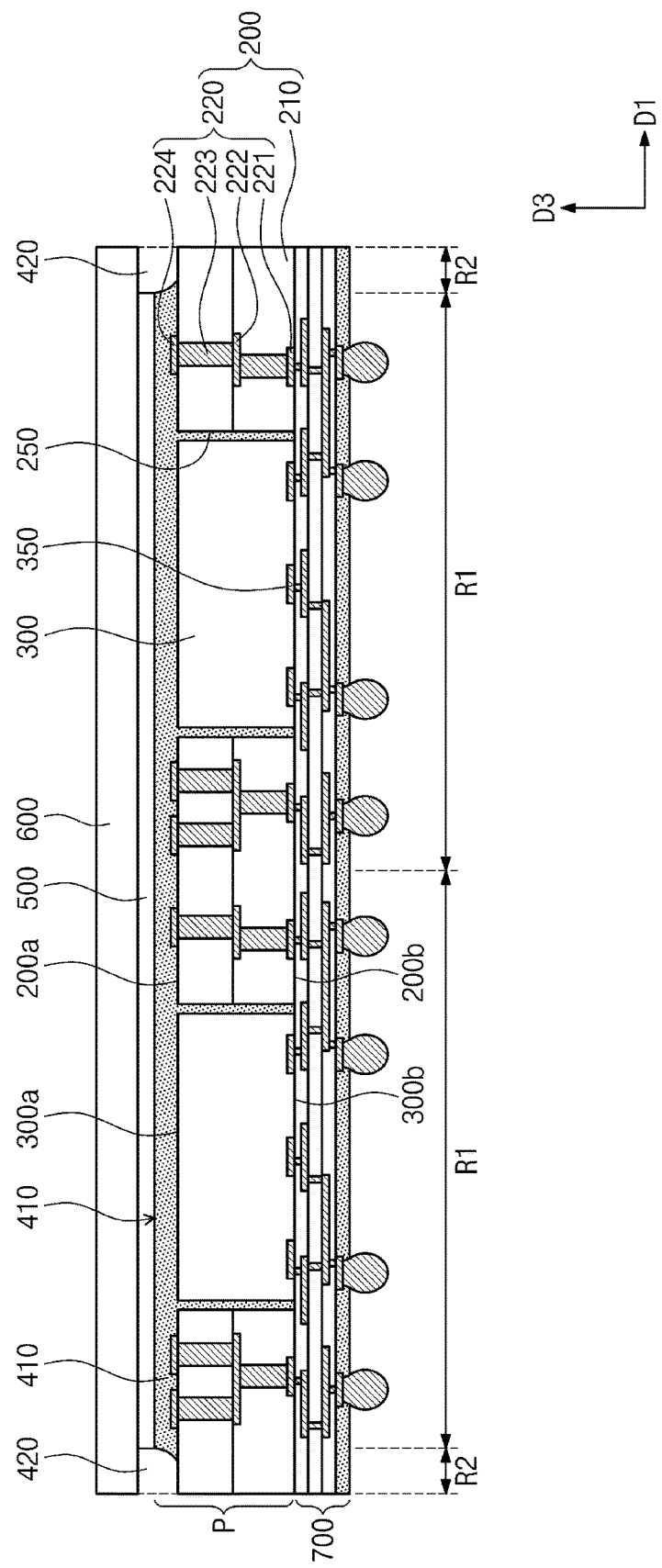
FIGS. 5A and 5B are cross-sectional views illustrating a process of removing a carrier substrate according to example embodiments.

A connection terminal 900 (e.g., a solder bump) may be formed between the first package P1 and the second package P2. The connection terminal 900 may be connected to the second substrate 800 and the second pad 224. The second package P2 may be electrically connected to the first package P1 by the connection terminal 900. FIGS. 5A and, 5B are cross-sectional views illustrating a removing process of a carrier substrate according to example embodiments. Hereinafter, the duplicated descriptions as described above may be omitted.

Referring to FIG. 5A, a preliminary package P may be provided. The preliminary package P may include a connection substrate 200, a plurality of first semiconductor chips 300, a molding pattern 400, a buffer pattern 500 and a carrier substrate 600. A formation of the connection substrate 200, the plurality of first semiconductor chips 300, the molding pattern 400, the buffer pattern 500 and the carrier substrate 600 may be the same as described in FIGS. 1B through 1E.

Thereafter, a first removing process of the carrier substrate 600 may be performed. For example, the first removing process of the carrier substrate 600 may be performed by treating chemicals on sidewalls of the molding pattern 400. The chemicals may react with the molding pattern 400, and thus a second portion 420 of the molding pattern 400 may be removed (as indicated by the region enclosed by the dashed lines). Thereafter, the carrier substrate 600 may be separated from the molding pattern 400 and may be detached from the preliminary package P.

Figure 5B:
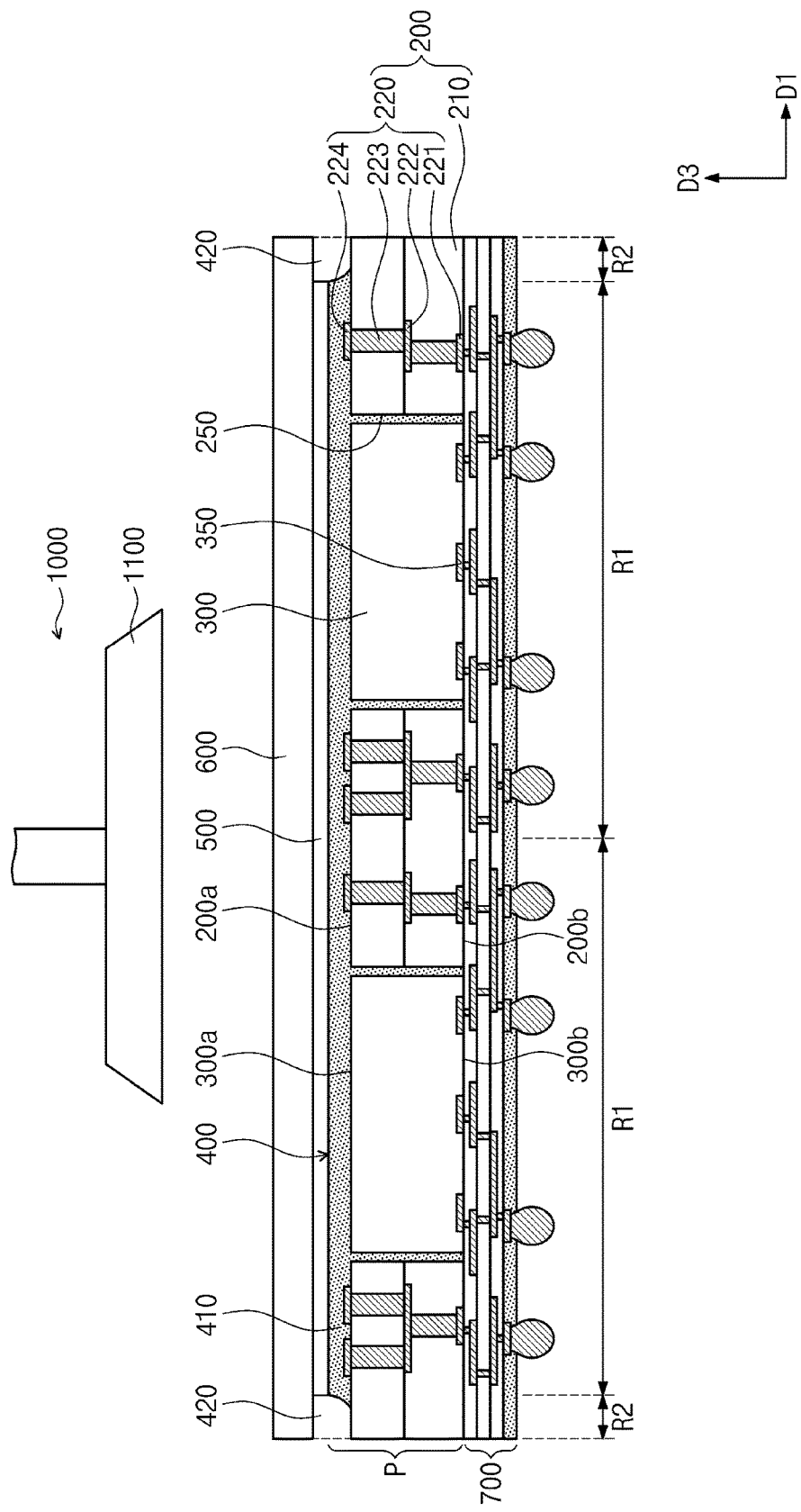

Referring to FIG. 5B, a second removing process of the carrier substrate 600 may be performed. The second removing process of the carrier substrate 600 may be performed by the same process as described in FIG. 2C. For example, the carrier substrate 600 may be detached from the molding pattern 400 using a removal apparatus 1000. After the second removing process of the carrier substrate 600, a first package P1 may be manufactured by substantially the same processes as described in FIGS. 2D through 3B. However, a second region R2 of the preliminary package P may be removed during the singulation process described in FIGS. 3A and 3B.

Figure 5C:
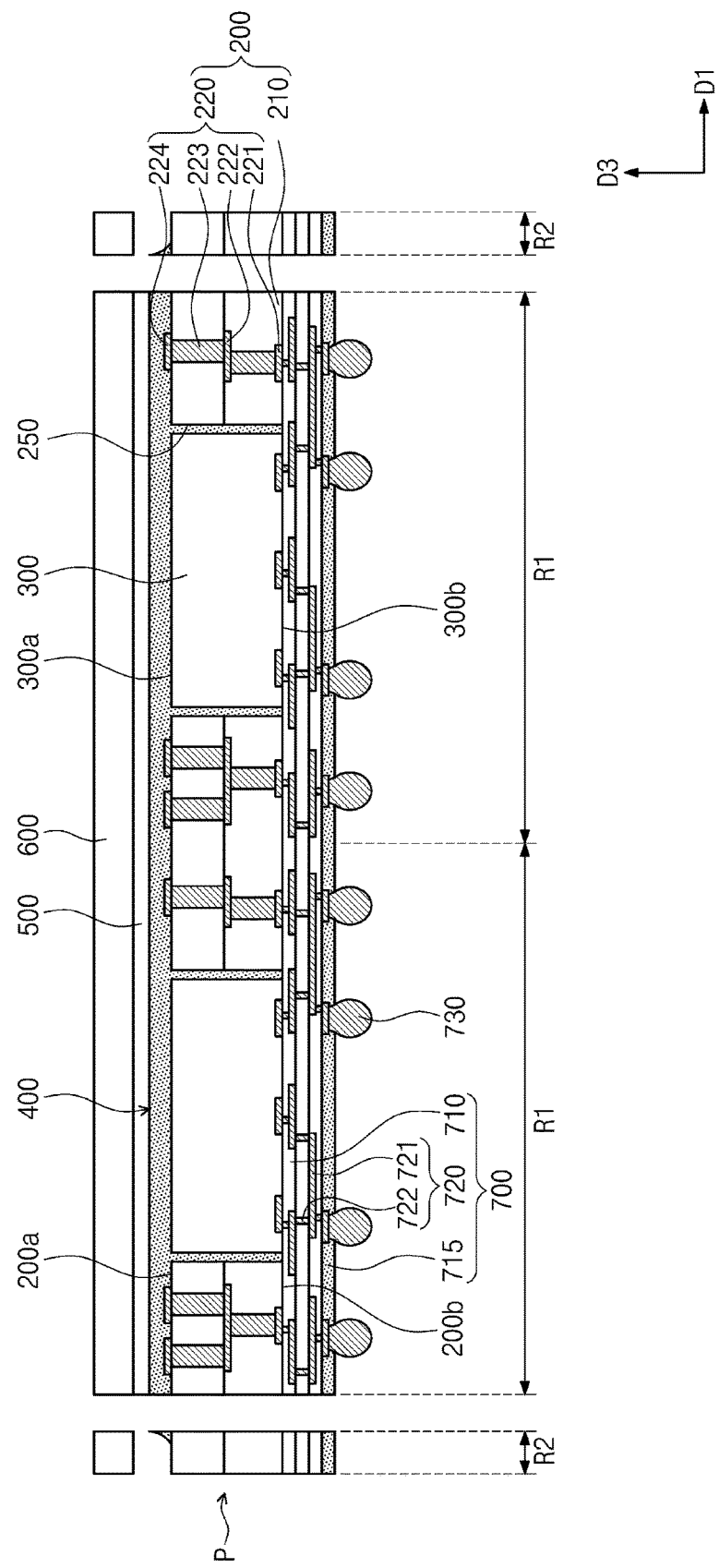
FIG. 5C is a cross-sectional view illustrating a first removing process of a carrier substrate according to example embodiments.

FIG. 5C is a cross-sectional view illustrating a first removing process of a carrier substrate according to example embodiments. Hereinafter, the duplicated descriptions as described above are omitted.

Referring to FIG. 5C, the preliminary package P may be processed as described above with respect to FIG. 5A. That is, the first removing process of the carrier substrate 600 may be performed. The first removing process of the carrier substrate 600 may be performed by treating chemicals on sidewalls of the molding pattern 400. Thereafter, a sawing process may be performed on the preliminary package P and the carrier substrate 600. The second region R2 of the preliminary package P may be separated from first regions R1 of the preliminary package P by the sawing process. At this time, a portion of the carrier substrate 600 and buffer pattern 500 may be removed as discussed above.

Figure 6A:
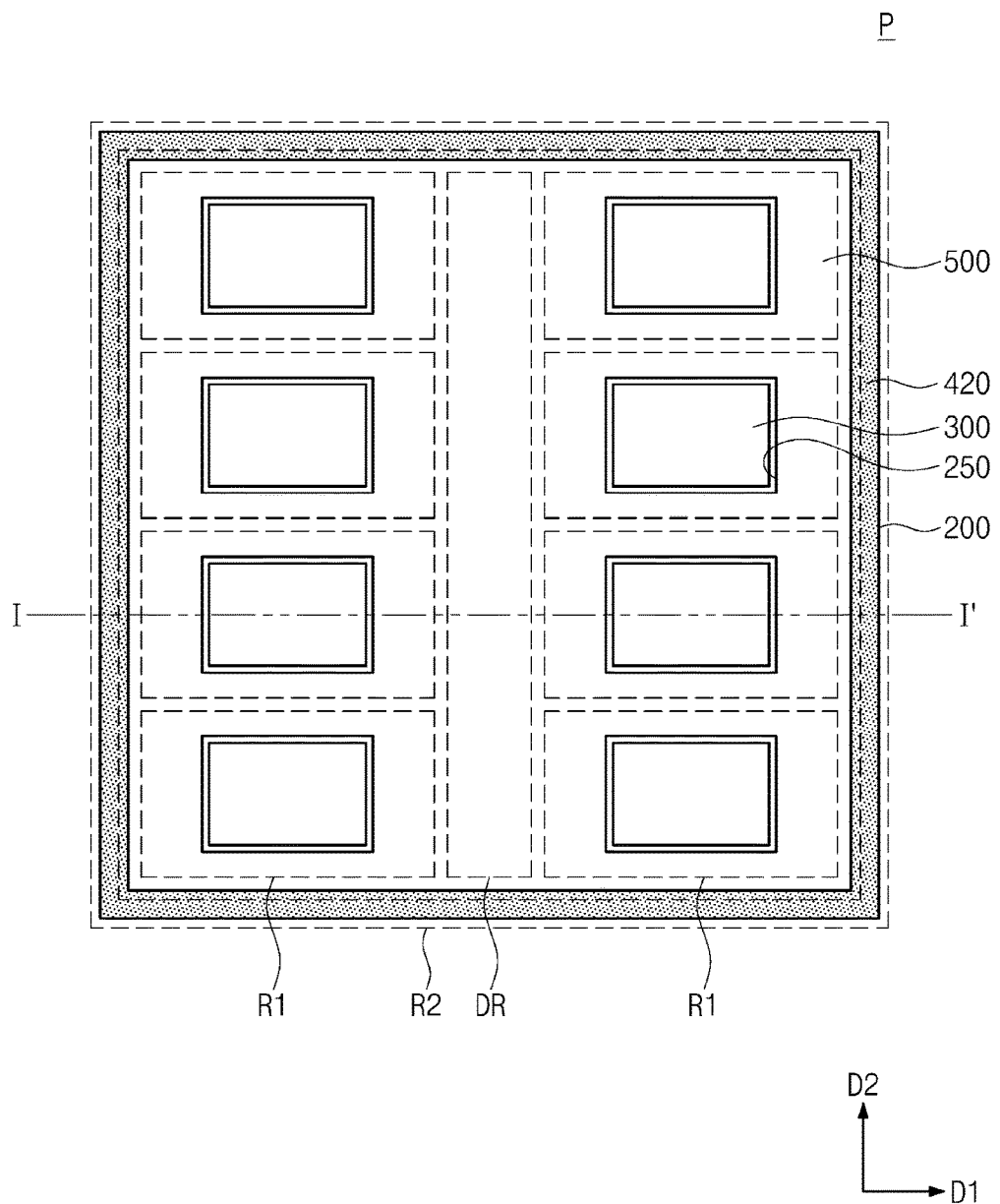
FIGS. 6A, 7A and 8A are plan views illustrating a method of manufacturing a semiconductor package according to example embodiments.
Figure 6B:
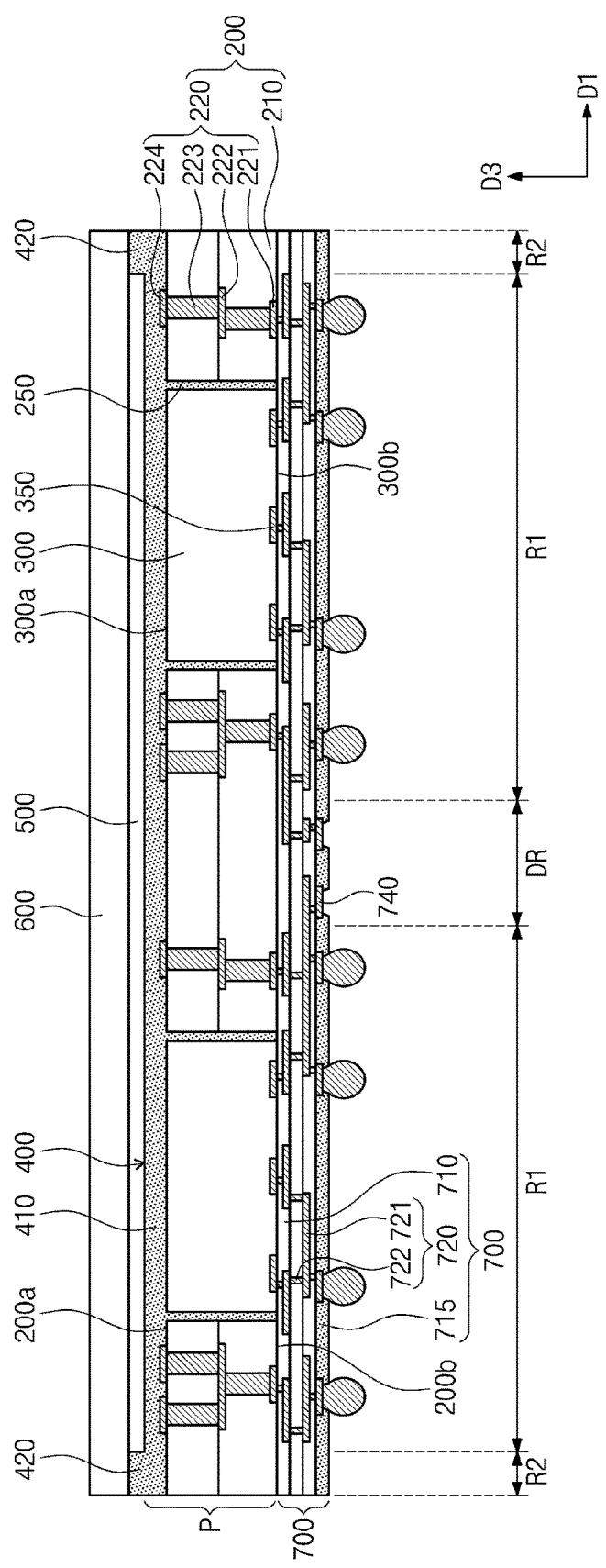
FIG. 6B is a cross-sectional view taken along line I-I' in FIG. 6A.
Figure 6C:
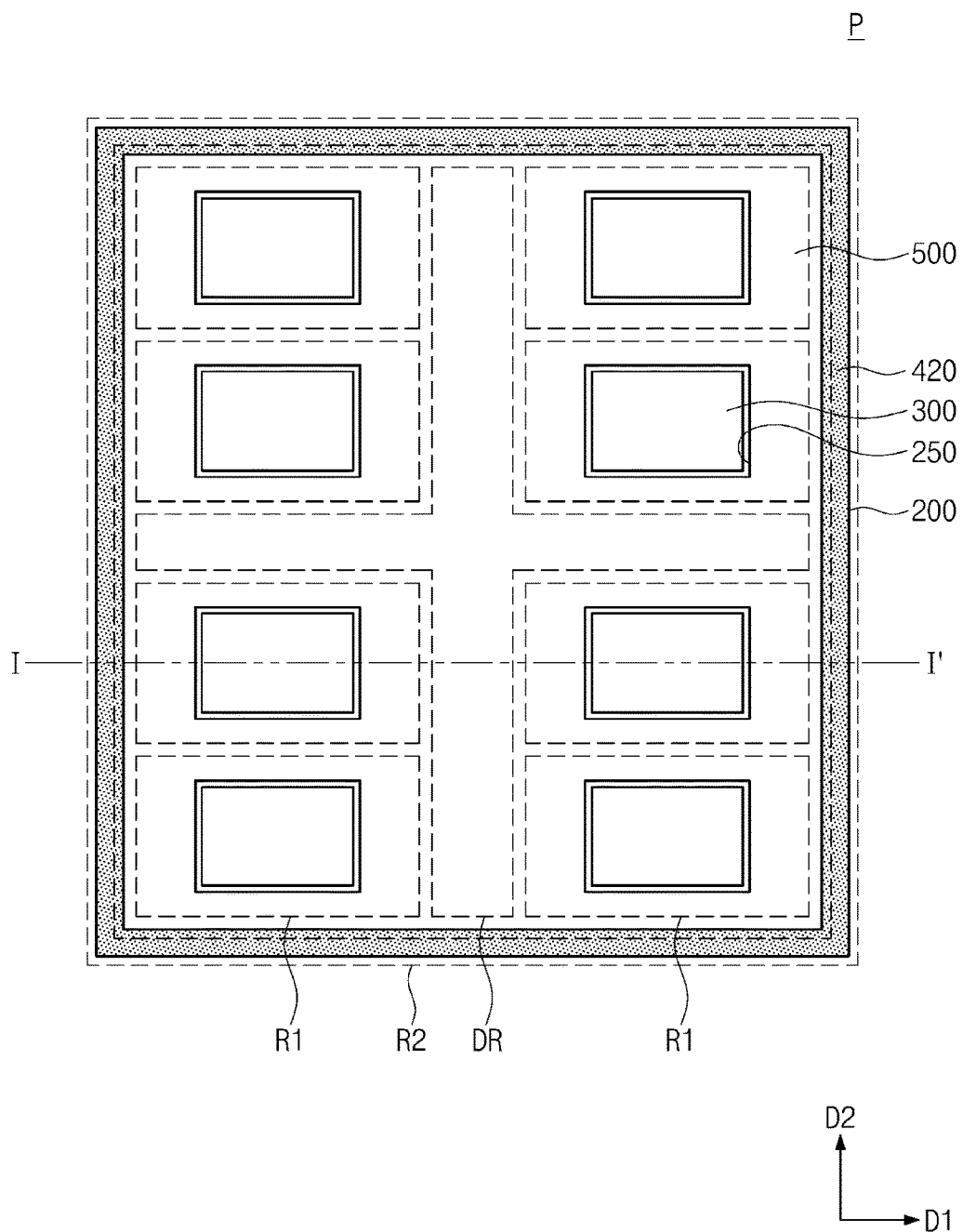
FIG. 6C is a cross-sectional view illustrating a preliminary package according to example embodiments.
Figure 7A:
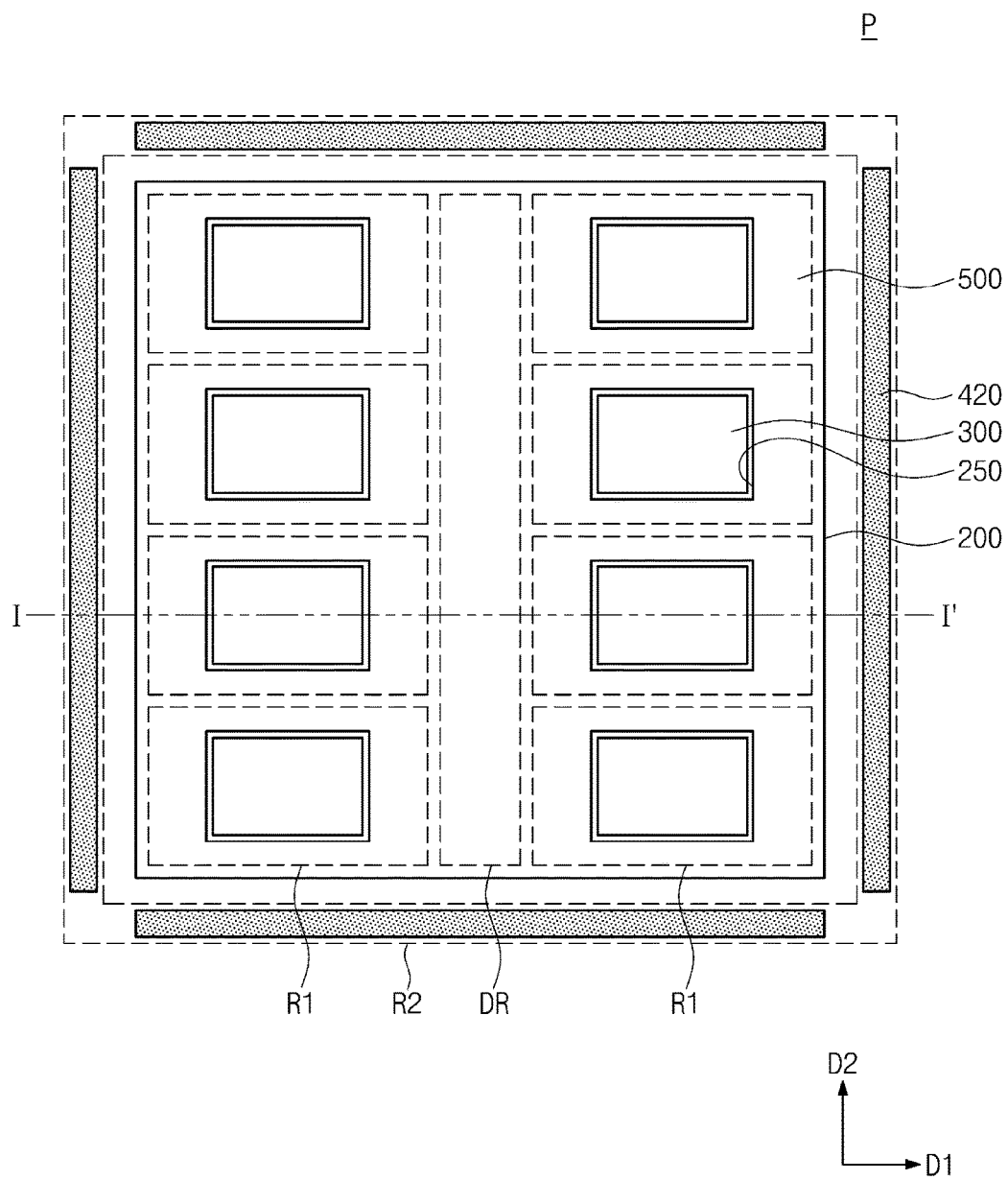
Figure 7B:
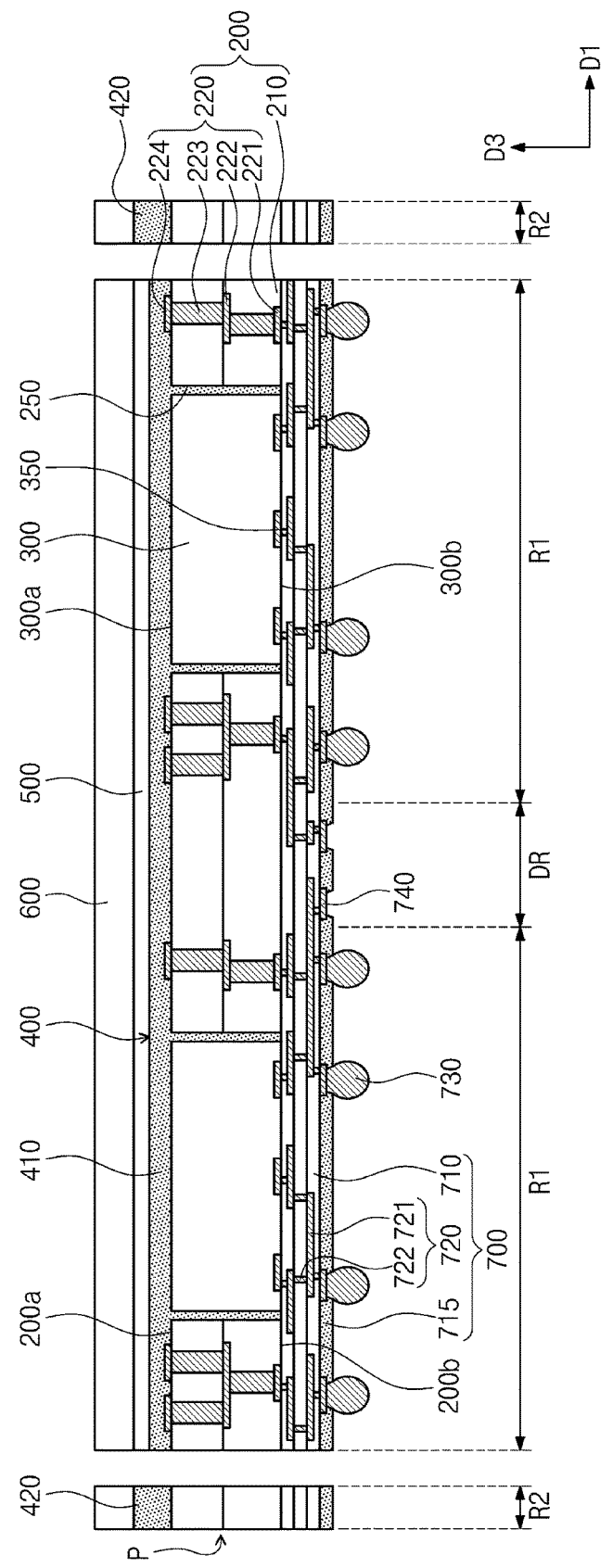
FIGS. 7B and 8B are cross-sectional views taken along line I-I' in FIGS. 7A and 8A, respectively.
Figure 8A:
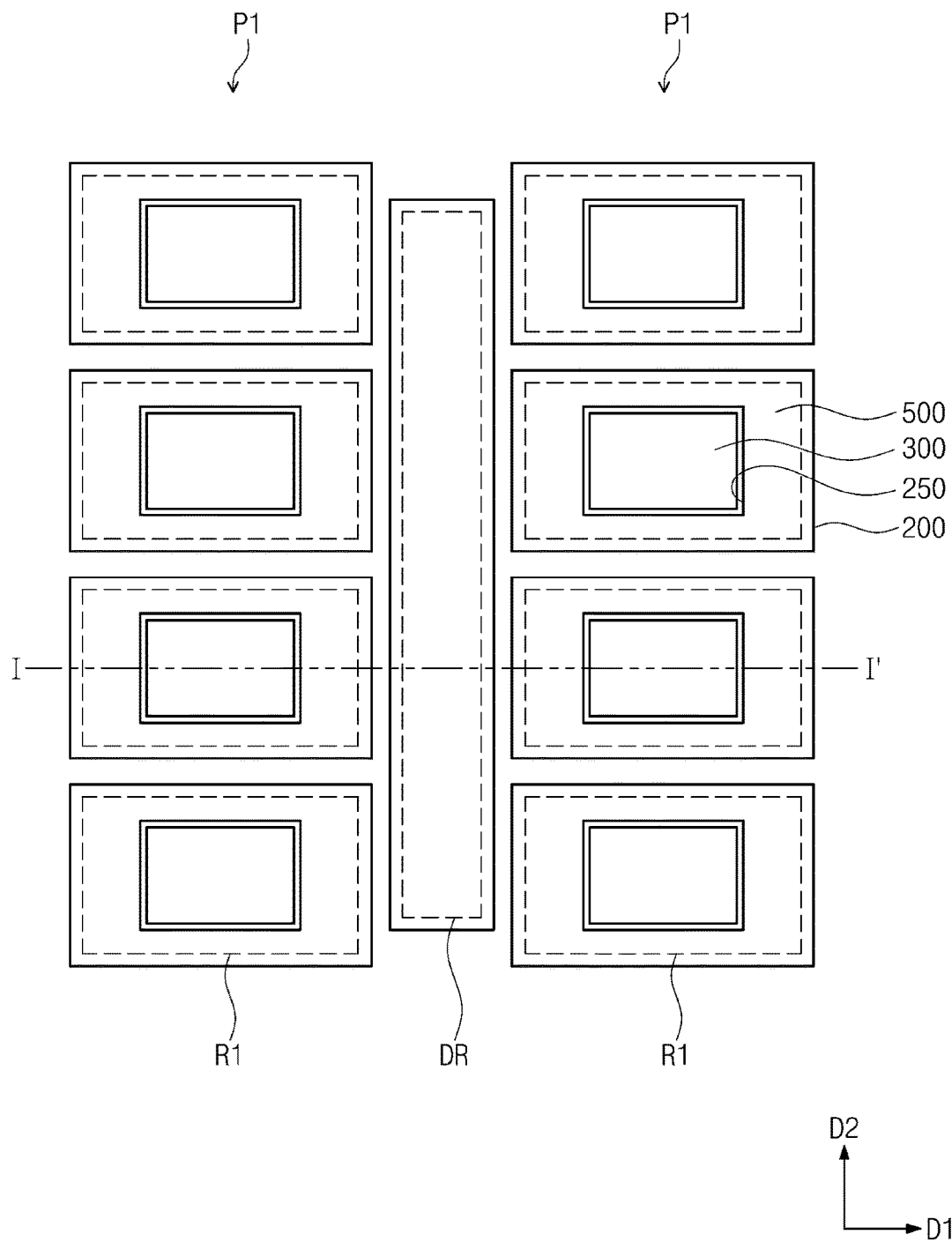
Figure 8B:
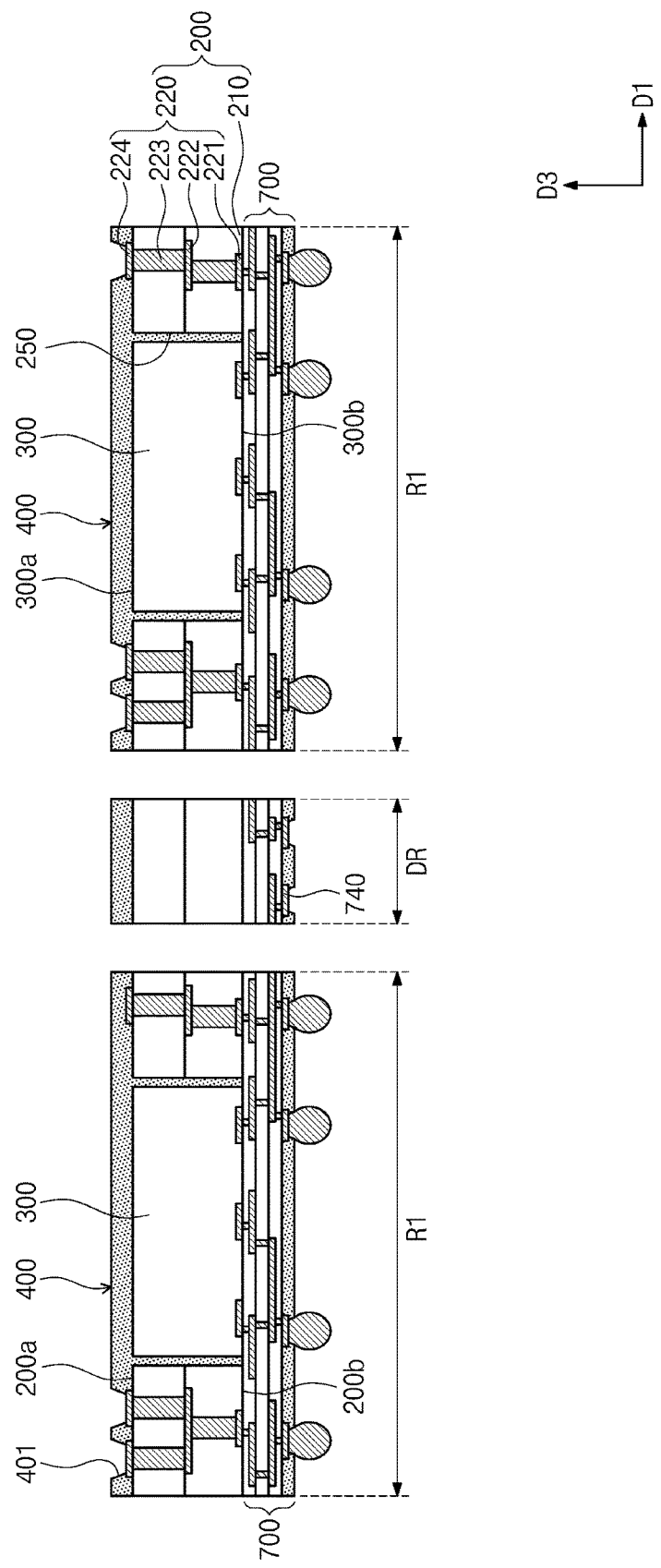

FIGS. 6A, 7A and 8A are plan views illustrating a method of manufacturing a semiconductor package according to example embodiments. FIGS. 6B, 7B and 8B are cross-sectional views taken along line I-I' in FIGS. 6A, 7A and 8A, respectively. Hereinafter, the duplicated descriptions as described above are omitted. FIG. 6C is a cross-sectional view illustrating a preliminary package according to example embodiments. Hereinafter, the duplicated descriptions as described above are omitted.

Referring to FIGS. 6A and 6B, a preliminary package P may be prepared. The preliminary package P may be formed by substantially the same process as described in FIGS. 1A and 1B. As exemplarily illustrated, however, the preliminary package P may include first regions R1, a second region R2 and a dummy region DR. The dummy region DR may be disposed between the first regions R1. As an example, the dummy region DR of the preliminary package P may extend in a second direction D2, when viewed in plan view. In other example, the dummy region DR of the preliminary package P may include a first portion extending in a first direction D1 and a second portion extending in the second direction D2, as shown in FIG. 6C. It should be recognized, however, that the layout of the dummy region DR (when viewed in plan view) may be varied as desired or otherwise suitable.

A buffer pattern 500 and a carrier substrate 600 may be disposed on the preliminary package P. A first substrate 700 may be formed on lower surfaces 300b of first semiconductor chips 300 and a lower surface 200b of a connection substrate 200.

A test pad 740 may be formed on a lower surface of the first substrate 700 in the dummy region DR. The test pad 740 may be electrically connected to a redistribution pattern 720. A test circuit may be disposed in the connection substrate 200 in the dummy region DR. The test circuit may be electrically connected to the test pad 740.

An electrical connection of the first substrate 700 may be tested. For example, a probe may be in contact with the test pad 740 to test an electrical connection of the redistribution pattern 720. The test of the electrical connection of the redistribution pattern 720 may include a test of an electrical short circuit or disconnection.

Referring to FIGS. 7A and 7B, the carrier substrate 600 and the buffer pattern 500 may be removed. The removing process of the carrier substrate 600 may be performed by substantially the same process as described above. For example, in a first removing process of the carrier substrate 600, the preliminary package P and the carrier substrate 600 may be sawed to separate the second region R2 of the preliminary package P, as well as a second portion of the carrier substrate 600 corresponding to the second region R2, from the first regions R1 of the preliminary package P, thereby removing the second region R2 from the preliminary package P. In other example, a second portion 420 of a molding pattern 400 may be removed by a chemical etching process as described in FIG. 5A. After the first removing process of the carrier substrate 600, the carrier substrate 600 may be detached from the preliminary package P. Next, the carrier substrate 600 and the buffer pattern 500 may be removed from the preliminary package P.

Referring to FIGS. 8A and 8B, the preliminary package P may be singulated to separate the first regions R1 of the preliminary package P from each other. Thus, the separated first regions R1 of the preliminary package P may form first packages P1, respectively. The dummy region DR of the preliminary package P may be separated from the first regions R1 thereof. Thus, the dummy region DR of the preliminary package P may be removed. Grooves 401 may be formed in the molding pattern 400 to expose a second pad 224. The grooves 401 may be formed either before or after the singulation of the preliminary package P.

Figure 9A:
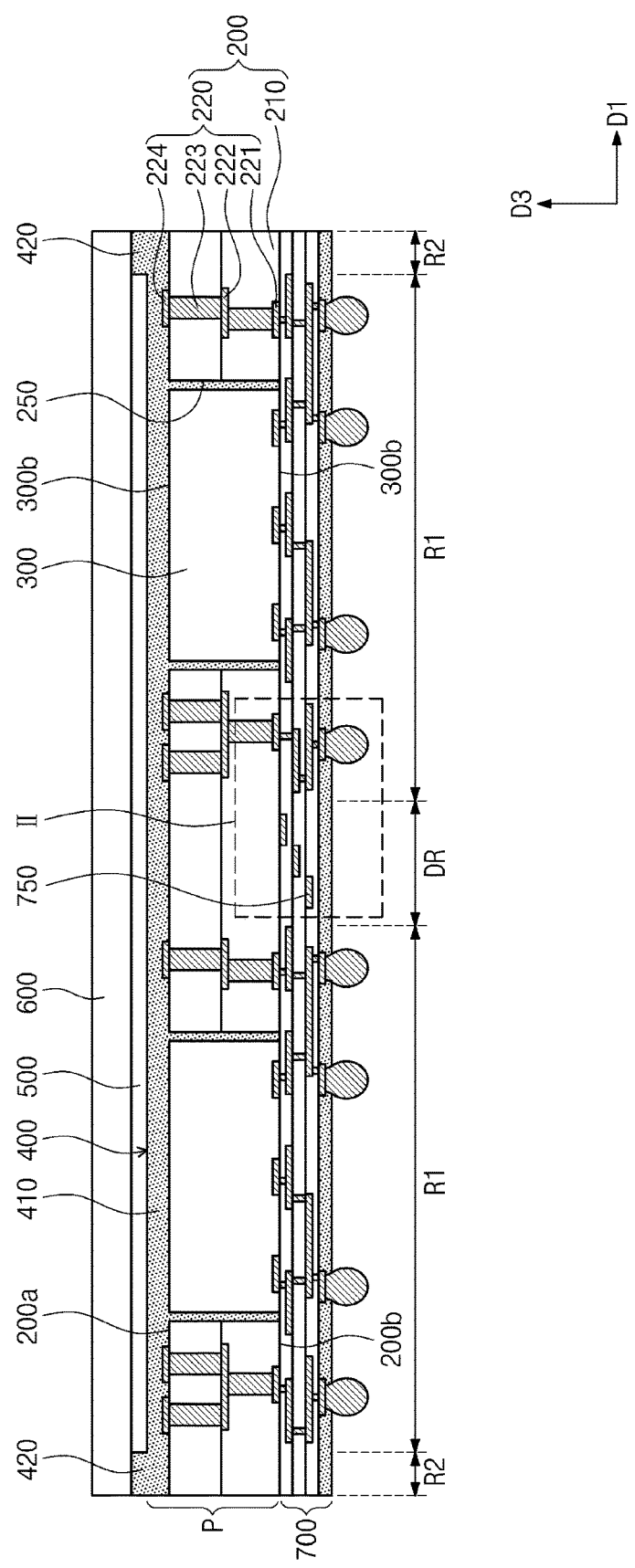
FIGS. 9A and 9C are cross-sectional views illustrating a method of manufacturing a semiconductor package according to example embodiments.
Figure 9B:
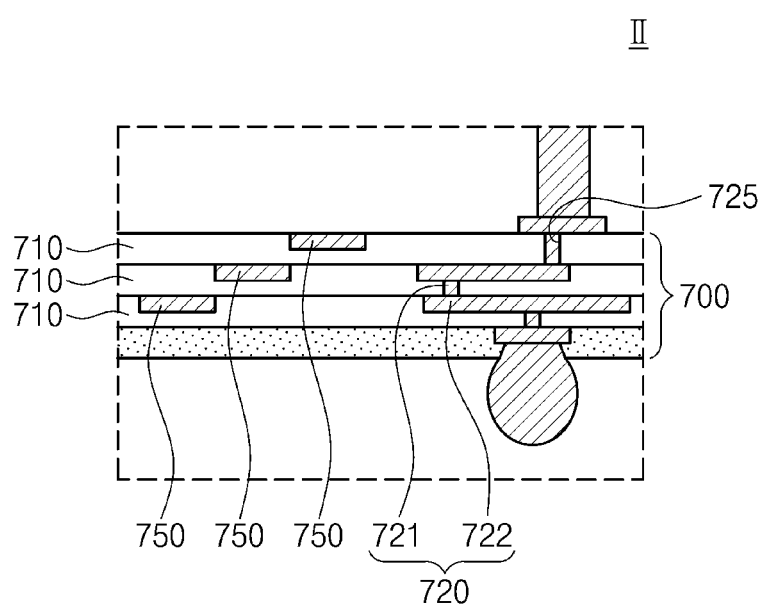
FIG. 9B is an enlarged view illustrating region II in FIG. 9A.
Figure 9C:
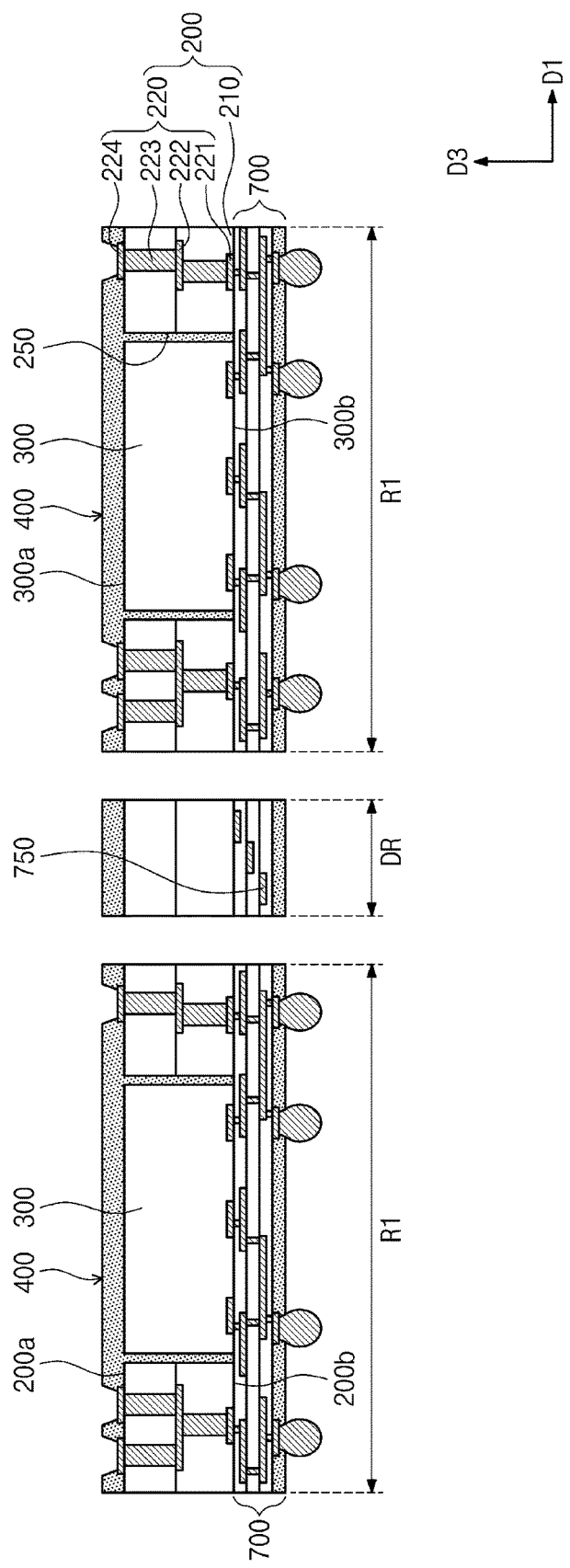

FIGS. 9A and 9C are cross-sectional views illustrating a method of manufacturing a semiconductor package according to example embodiments. FIG. 9A is a cross-sectional view taken along line I-I' of FIG. 6A. FIG. 9B is an enlarged view illustrating region II in FIG. 9A. FIG. 9C is a cross-sectional view taken along line I-I' of FIG. 8A. Hereinafter, the duplicated descriptions as described above are omitted.

Referring to FIGS. 6A, 9A and 9B, alignment keys 750 may be formed in a first substrate 700 in a dummy region DR. The alignment keys 750 may be formed in insulating patterns 710 of the first substrate 700. A conductive via 722 of a redistribution pattern 720 may be formed by etching the insulating patterns 710 to form a via hole 725 and filling the via hole with a conductive material. A conductive layer may be formed on each of the insulating patterns 710 and the conductive layer may be etched to form a conductive pattern 721. The etching process for forming the via hole 725 and the conductive pattern 721 may be performed using the alignment keys 750, and thus alignment or misalignment of a photomask may be confirmed.

After the formation of the first substrate 700, a carrier substrate 600 and a buffer pattern 500 may be removed. A preliminary package P and the carrier substrate 600 may be sawed to separate a second region R2 of the preliminary package P and the carrier substrate 600 from first regions R1 of the preliminary package P, thereby removing the second region R2 of the preliminary package P and the carrier substrate 600 from the preliminary packager P.

Referring to FIGS. 8A and 9C, the preliminary package P may be singulated to manufacture first packages P1. At this time, the first regions R1 of the preliminary package P may form first packages P1, respectively, and the dummy region DR of the preliminary package P may be removed.

Figure 10A:
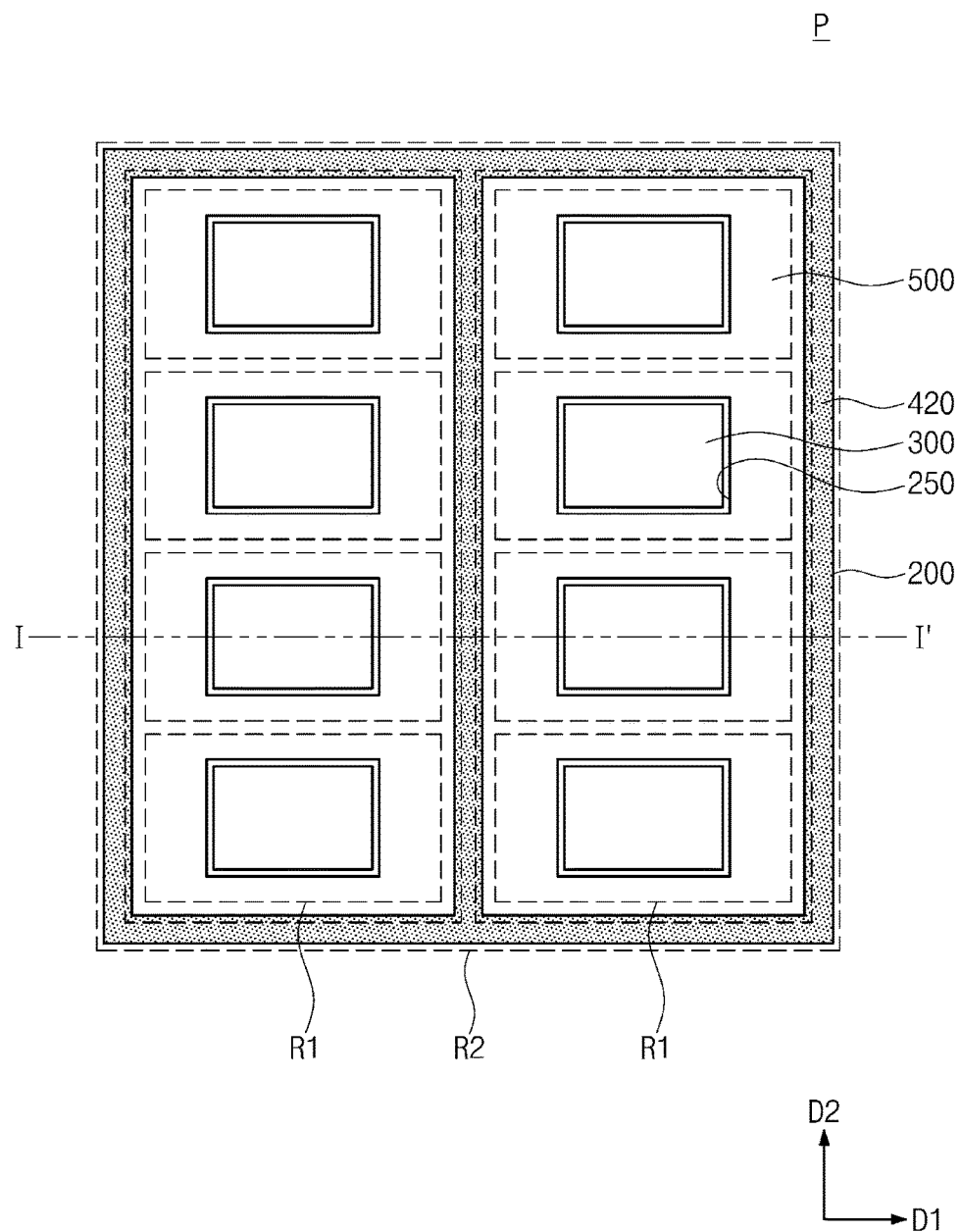
FIGS. 10A an 11A are plan views illustrating a method of manufacturing a semiconductor package according to example embodiments.
Figure 10B:
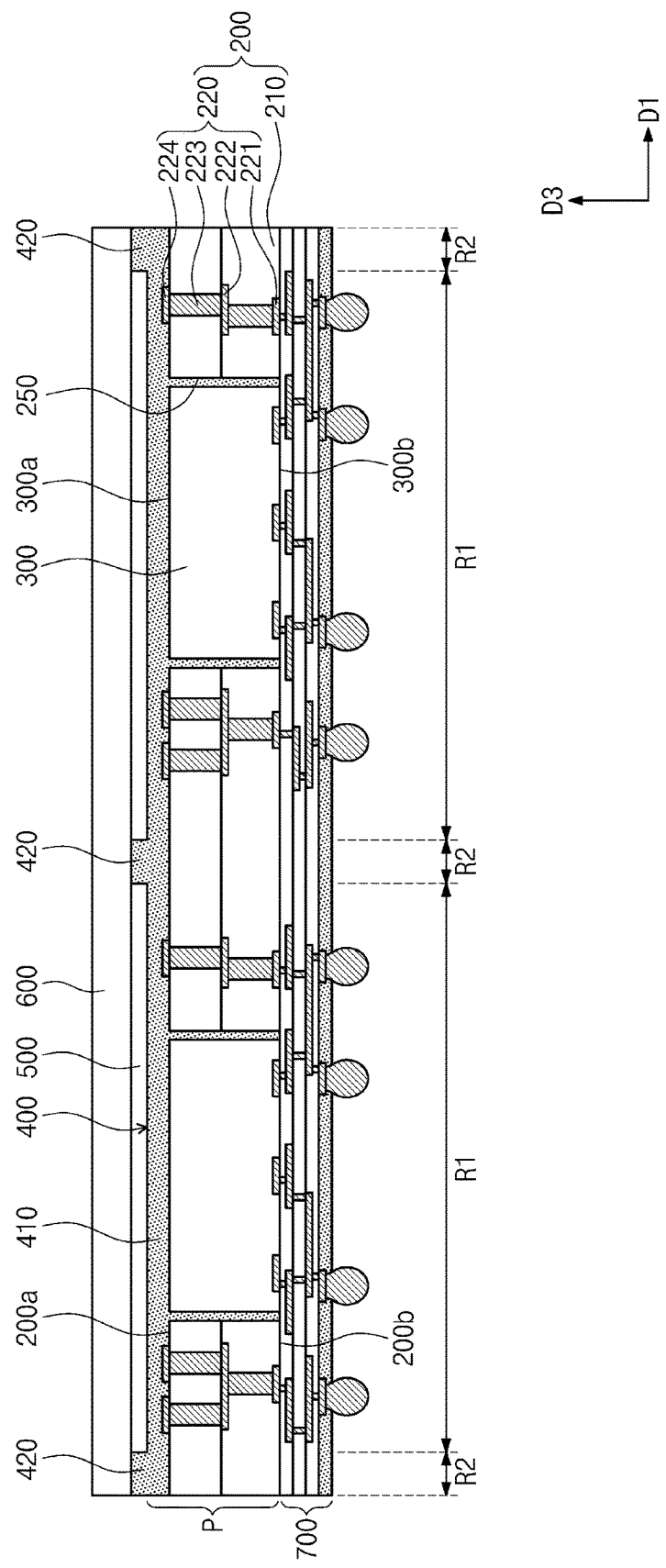
FIGS. 10B and 11B are cross-sectional views taken along line I-I' in FIGS. 10A and 11A, respectively.

FIGS. 10A an 11A are plan views illustrating a method of manufacturing a semiconductor package according to example embodiments. FIGS. 10B and 11B are cross-sectional views taken along line I-I' in FIGS. 10A and 11A, respectively. Hereinafter, the duplicated descriptions as described above are omitted Referring to FIGS. 10A and 10B, a second region R2 of a preliminary package P may be overlapped with an edge region of the preliminary package P, when viewed in plan view, and may extend between first regions R1 of the preliminary package P. The second region R2 of the preliminary package P may cross a central region of the preliminary package P along a second direction D2. A plurality of buffer patterns 500 may be disposed on the preliminary package P. The buffer patterns 500 may be overlapped with the first regions R1 of the preliminary package P. The buffer patterns 500 may not be disposed on the second region R2 of the preliminary package P. The buffer patterns 500 may be spaced apart from each other in the first direction D1 in plan view. A second portion 420 of a molding pattern 400 may be exposed by the buffer patterns 500. A carrier substrate 600 may be attached to the preliminary package P by the second portion 420 of the molding pattern 400.

Figure 11A:
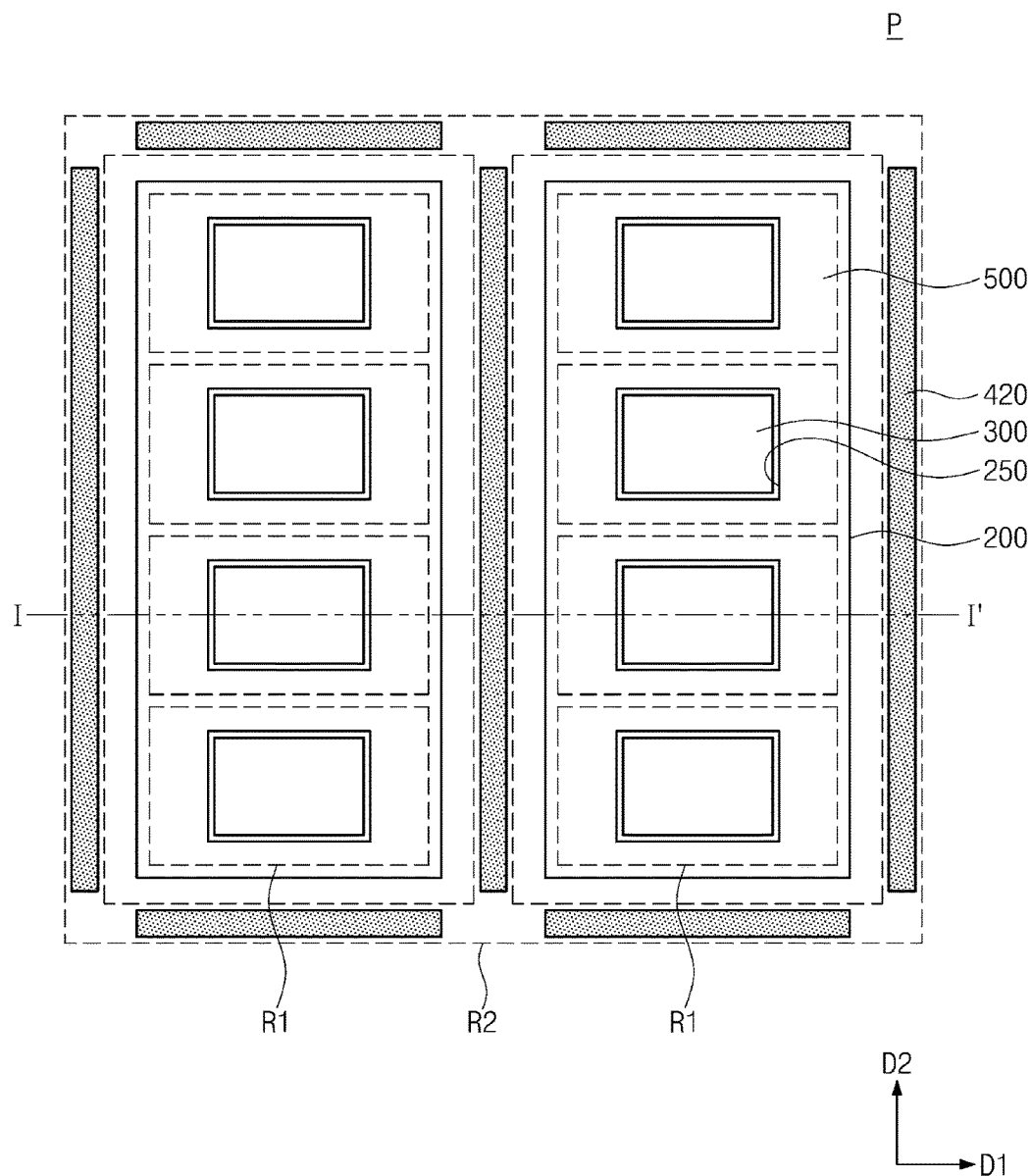
Figure 11B:
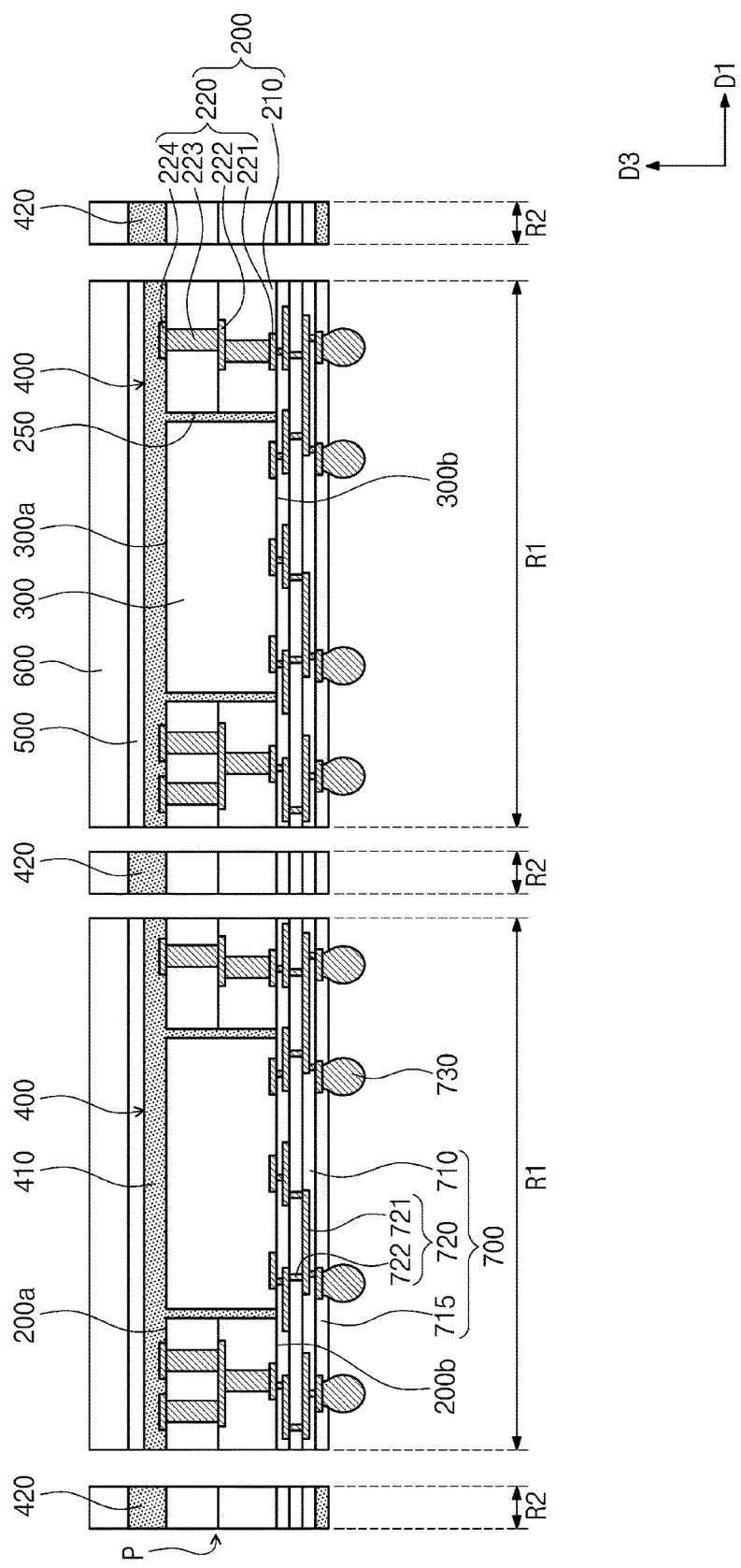

Referring to FIGS. 11A and 11B, a first removing process of the carrier substrate 600 may be performed by sawing the carrier substrate 600 and the preliminary package P. The second region R2 of the preliminary package P and the carrier substrate 600 on the second region R2 of the preliminary package P may be removed as discussed above. In some embodiments, the first removing process of the carrier substrate 600 may further include treating sidewalls of the preliminary package P with a chemical etching process (e.g., as described above) before the sawing process of the carrier substrate 600 and the preliminary package P is performed. A semiconductor package may thereafter be manufactured by substantially the same processes as described in FIGS. 2C through 4.

Figure 12A:
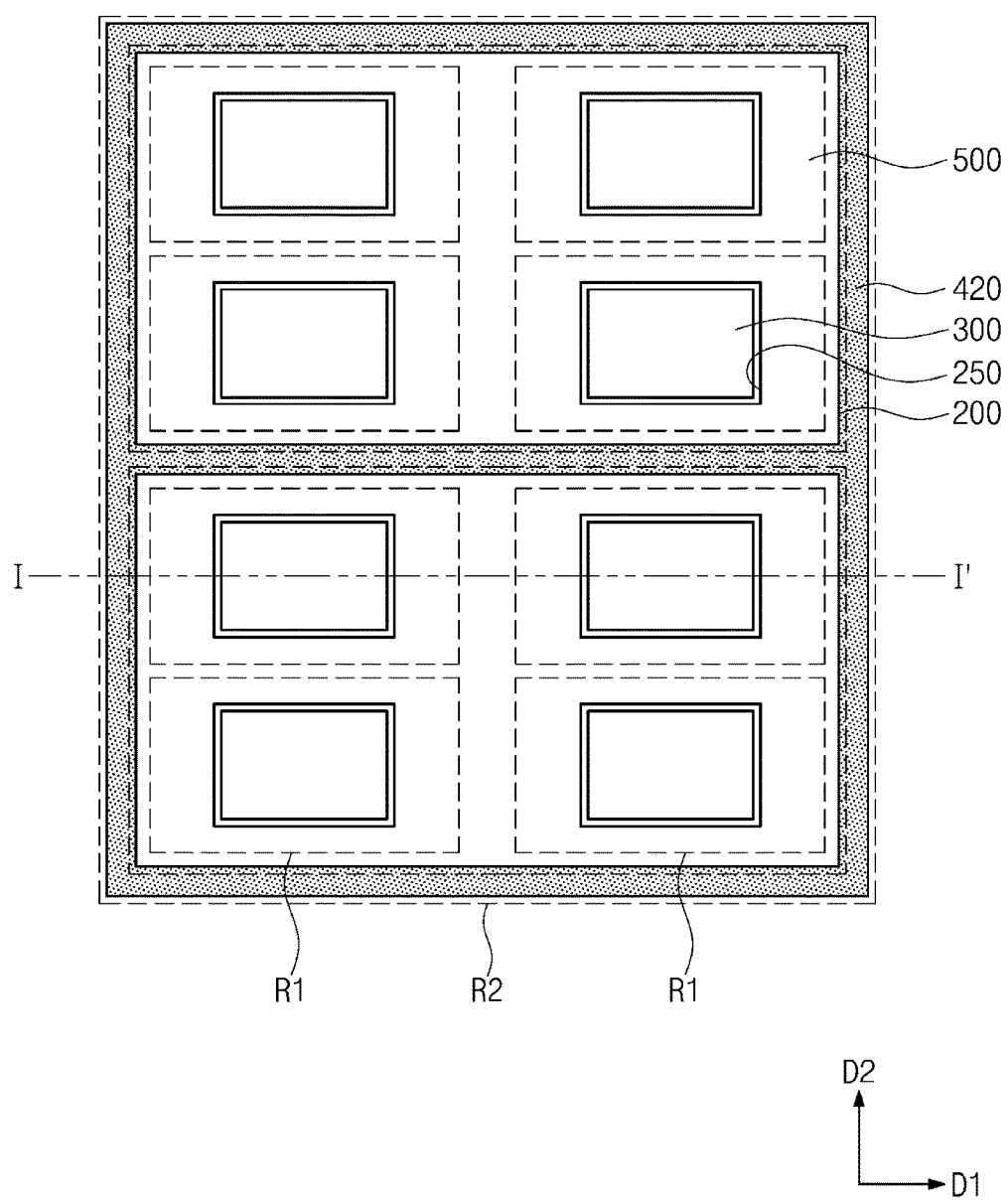
FIGS. 12A and 12B are plan views illustrating a preliminary package according to example embodiments.
Figure 12B:
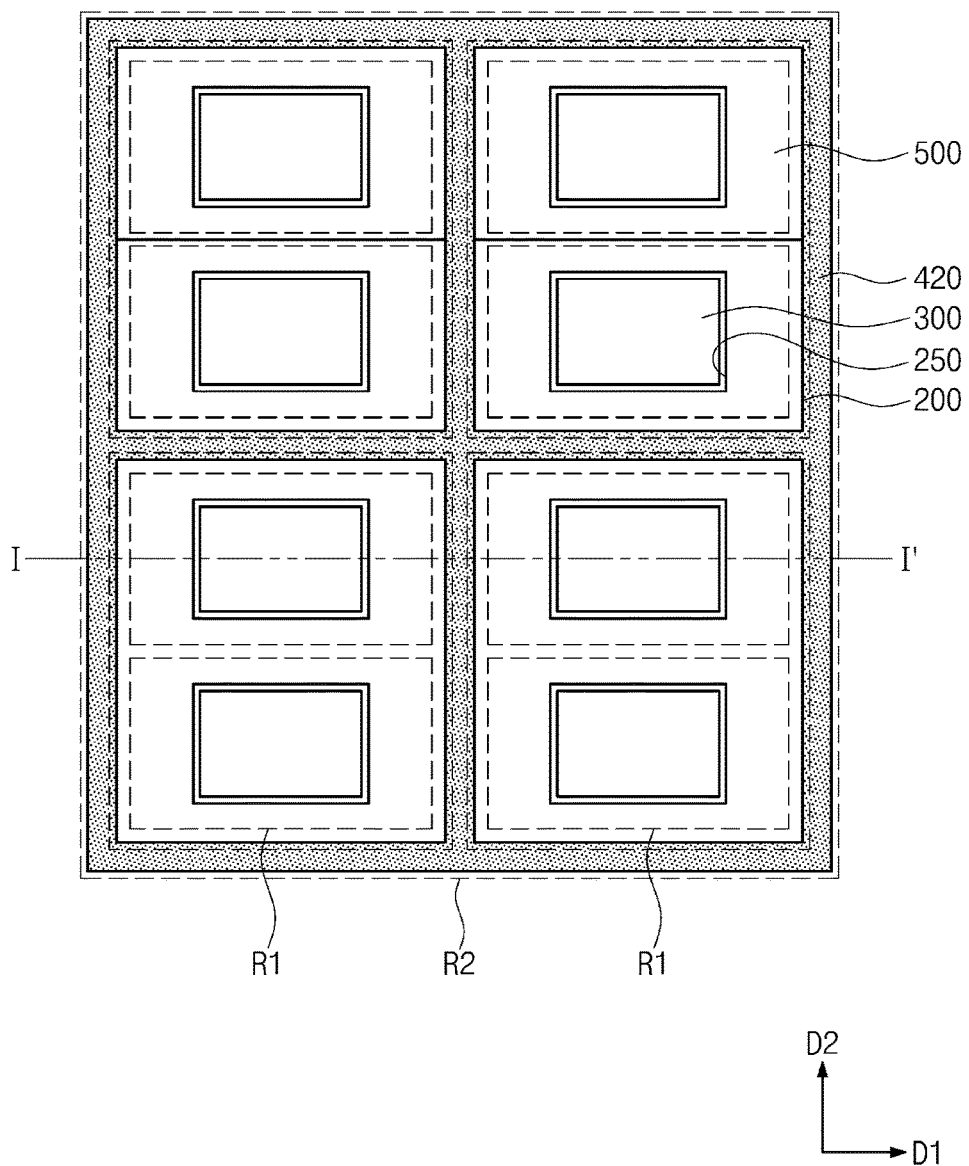

FIGS. 12A and 12B are plan views illustrating a preliminary package according to example embodiments. Hereinafter, the duplicated descriptions as described above are omitted.

Referring to FIGS. 12A and 12B, a second region R2 of a preliminary package P may be further provided between first regions R1 of the preliminary package P. A plurality of buffer patterns 500 may be provided on the preliminary package P. The buffer patterns 500 may be spaced apart from each other in a second direction D2, when viewed in plan view. In some embodiments, as shown in FIG. 12A, a second region R2 of the preliminary package P may cross a central region of the preliminary package P in a first direction D1. In other embodiments, as shown in FIG. 12B, the second region R2 of the preliminary package P cross the central region of the preliminary package P in both the first and the second directions D1 and D2. Regardless of the direction(s) in which the second region R2 of the preliminary package P crosses the central region of the preliminary package P, a first removing process of a carrier substrate 600 may be performed by substantially the same process as described in FIGS. 11A and 11B.

Figure 13:
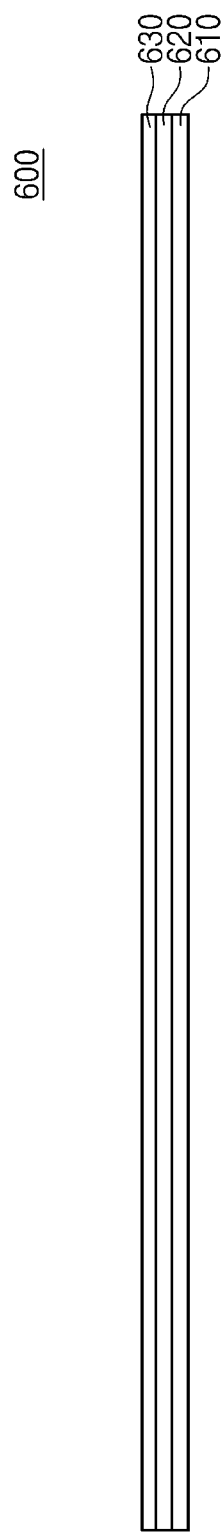
FIG. 13 is a cross-sectional view illustrating a carrier substrate according to example embodiments.

FIG. 13 is a cross-sectional view illustrating a carrier substrate according to example embodiments. Hereinafter, the duplicated descriptions as described above are omitted.

Referring to FIG. 13, a carrier substrate 600 may include a first layer 610, a second layer 620 and a third layer 630 which are sequentially stacked. For example, the first layer 610 and the third layer 630 may include a metal such as copper. The second layer 620 may include an inorganic material such as a glass fiber.

Referring again to FIG. 1C, the carrier substrate 600 described in FIG. 13 may be used. In this case, the first layer 610 may be provided to face toward the preliminary package P and may be attached to the buffer pattern 500. However, the carrier substrate 600 may be varied without being limited thereto.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A method of manufacturing a semiconductor package, the method comprising:
    forming a preliminary package on a supporting substrate, the preliminary package including a connection substrate, a semiconductor chip and a molding pattern on the connection substrate and the semiconductor chip;
    forming a buffer pattern on the molding pattern; and
    forming a carrier substrate on the buffer pattern and the molding pattern, the carrier substrate including a first portion contacting the buffer pattern and a second portion contacting the molding pattern.

2. The method according to claim 1, wherein the buffer pattern includes a non-adhesive material.

3. The method according to claim 1, further comprising removing the carrier substrate,
    wherein removing the carrier substrate includes:
    a first removing process of removing the second portion of the carrier substrate by performing a sawing process on the carrier substrate: and a second removing process of separating the carrier substrate from the buffer pattern.

4. The method according to claim 3, further comprising:
removing the supporting substrate to expose a lower surface of the preliminary package; and
forming a redistribution substrate on the lower surface of the preliminary package,
wherein removing the carrier substrate is performed after forming the redistribution substrate.

5. The method according to claim 4, wherein the redistribution substrate includes insulating patterns and a redistribution pattern.

6. The method according to claim 5, wherein the redistribution pattern is electrically connected to the semiconductor chip and the connection substrate.

7. The method according to claim 1, wherein the second portion of the carrier substrate is overlapped with an edge region of the preliminary package in plan view.

8. A method of manufacturing a semiconductor package, the method comprising:
providing a preliminary package, the preliminary package including a connection substrate, a semiconductor chip and a molding pattern;
providing a buffer pattern on a first portion of the molding pattern, the buffer pattern exposing an upper surface of a second portion of the molding pattern;
providing a carrier substrate on the buffer pattern and the molding pattern, the carrier substrate contacting the upper surface of the second portion of the molding pattern; and
removing the second portion of the molding pattern to detach the carrier substrate from the molding pattern.

9. The method according to claim 8, wherein the carrier substrate is attached to the preliminary package by the second portion of the molding pattern.

10. The method according to claim 8, further comprising, after detaching the carrier substrate, removing the carrier substrate from the preliminary package.

11. The method according to claim 10, further comprising, after removing the carrier substrate, disposing an upper package on the molding pattern,
wherein the connection substrate includes a base layer and a conductive member in the base layer, and
wherein the upper package is electrically connected to the conductive member.

12. The method according to claim 8, wherein the second portion of the molding pattern is provided in an edge region of the preliminary package.

13. The method according to claim 8, wherein removing the second portion of the molding pattern includes sawing the carrier substrate and the preliminary package to separate the second portion of the molding pattern from the first portion of the molding pattern.

14. The method according to claim 8, wherein removing the second portion of the molding pattern includes chemically etching a sidewall of the preliminary package.

15. The method according to claim 8, wherein after providing the carrier substrate, the upper surface of the second portion of the molding pattern is substantially coplanar with an upper surface of the buffer pattern.

16. A method of manufacturing a semiconductor package, the method comprising:
forming a package on a supporting substrate, the package including a connection substrate including openings exposing the supporting substrate, semiconductor chips in respective ones of the openings and a molding pattern covering the supporting substrate and the semiconductor chips;
forming a buffer pattern on the package, the buffer pattern exposing the molding pattern; and
forming a carrier substrate on the buffer pattern and the molding pattern, the carrier substrate contacting an upper surface of the buffer pattern and an upper surface of the exposed molding pattern.

17. The method according to claim 16, wherein the buffer pattern includes a non-adhesive material.

18. The method according to claim 16, wherein the buffer pattern includes a plurality of buffer patterns spaced apart from each other, and
wherein the molding pattern is present in a gap between the buffer patterns.

19. The method according to claim 16, further comprising forming a substrate on a lower surface of the package,
wherein the substrate includes first regions overlapped with the semiconductor chips, respectively, when viewed in plan view, and a dummy region between the first regions, and
wherein a test pad and/or an alignment key is formed in the dummy region of the substrate.

20. The method according to claim 16, wherein the carrier substrate contacts the molding pattern in an edge region of the package.

* * * * *